US012262602B2

(12) United States Patent
Kim et al.

(10) Patent No.: US 12,262,602 B2
(45) Date of Patent: Mar. 25, 2025

(54) LEAD-IN WIRING OVERLAPPING SEALING MEMBER AND DISPLAY DEVICE HAVING THE SAME

(71) Applicant: Samsung Display Co., LTD., Yongin-si (KR)

(72) Inventors: Min Chang Kim, Cheonan-si (KR); Eun Kyung Yang, Seoul (KR); Jun Ho Choi, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 669 days.

(21) Appl. No.: 17/323,532

(22) Filed: May 18, 2021

(65) Prior Publication Data

US 2021/0376048 A1     Dec. 2, 2021

(30) Foreign Application Priority Data

Jun. 2, 2020   (KR) .......................... 10-2020-0066272

(51) Int. Cl.
*H10K 59/131*     (2023.01)
*H10K 50/842*     (2023.01)
*H10K 59/88*      (2023.01)

(52) U.S. Cl.
CPC ....... *H10K 59/131* (2023.02); *H10K 50/8426* (2023.02); *H10K 59/88* (2023.02)

(58) Field of Classification Search
CPC ... H10K 59/131; H10K 59/88; H10K 50/8426
See application file for complete search history.

(56) References Cited

U.S. PATENT DOCUMENTS

| 10,937,854 | B2 | 3/2021 | Chung et al. |
| 11,211,443 | B2 | 12/2021 | Lee et al. |
| 11,785,818 | B2 | 10/2023 | Chung et al. |
| 12,114,551 | B2 | 10/2024 | Chung et al. |
| 2015/0171366 | A1* | 6/2015 | Kim ..................... H10K 71/621 257/40 |

(Continued)

FOREIGN PATENT DOCUMENTS

| JP | 3830115 B2 | 10/2006 |
| JP | 4512976 B2 | 7/2010 |

(Continued)

*Primary Examiner* — Lex H Malsawma
(74) *Attorney, Agent, or Firm* — CANTOR COLBURN LLP

(57) ABSTRACT

A display device includes a voltage wiring pattern in a non-display area and connected to a display area, and between a pad area and the voltage wiring pattern, a metal wiring pattern in the non-display area and connecting the pad area to the voltage wiring pattern, and a sealing member between the pad area and the voltage wiring pattern, and coupling the display panel to an encapsulation substrate. The metal wiring pattern including a lead-in portion connected to the pad area, an overlapping portion overlapping the sealing member, and a connection portion connecting the overlapping portion to the voltage wiring pattern. The overlapping portion includes a first portion corresponding to the lead-in portion, a second portion corresponding to the connection portion, and a third portion extending from the second portion in a direction away from the first portion.

20 Claims, 16 Drawing Sheets

(56) References Cited

U.S. PATENT DOCUMENTS

| | | | | |
|---|---|---|---|---|
| 2017/0033312 A1* | 2/2017 | Kim | ............... | H10K 59/131 |
| 2017/0365814 A1* | 12/2017 | Kim | ............... | H10K 50/8445 |
| 2018/0013094 A1* | 1/2018 | Kim | ............... | H01L 23/10 |
| 2018/0145127 A1* | 5/2018 | Shin | ............... | H10K 59/1315 |
| 2019/0043938 A1* | 2/2019 | Lee | ............... | H10K 59/123 |
| 2020/0303488 A1* | 9/2020 | Lee | ............... | H10K 59/131 |
| 2021/0305351 A1* | 9/2021 | Cho | ............... | H10K 50/80 |

FOREIGN PATENT DOCUMENTS

| | | |
|---|---|---|
| KR | 1020110011990 A | 2/2011 |
| KR | 10-1760676 B1 | 7/2017 |
| KR | 20190014610 A | 2/2019 |
| KR | 20190130092 A | 11/2019 |

\* cited by examiner

LEAD-IN WIRING OVERLAPPING SEALING MEMBER AND DISPLAY DEVICE HAVING THE SAME

This application claims priority to Korean Patent Application No. 10-2020-0066272 filed on Jun. 2, 2020, and all the benefits accruing therefrom under 35 U.S.C. 119, the contents of which in its entirety are herein incorporated by reference.

BACKGROUND

1. Field

The disclosure relates to a display device.

2. Description of the Related Art

With the advance of an information-oriented society, more and more demands are placed on display devices for displaying images in various ways. For example, display devices are employed in various electronic devices such as smartphones, digital cameras, laptop computers, navigation devices and smart televisions. The display device may be a flat panel display device such as a liquid crystal display device, a field emission display device and a light emitting display device.

The importance of display devices has steadily increased with the development of multimedia technology. Accordingly, various types of display devices such as an organic light emitting display ("OLED"), a liquid crystal display ("LCD") and the like have been used. In order to increase a display area where an image is displayed, a bezel area except for the display area, or a non-display area, is minimized.

SUMMARY

Embodiments of the invention provide a display device having a minimum stepped portion of a sealing member, by utilizing a metal wiring portion (e.g., metal wiring pattern) that is extended from a pad area to overlap the sealing member.

However, embodiments are not restricted to the one set forth herein. The above and other features of the invention will become more apparent to one of ordinary skill in the art to which the invention pertains by referencing the detailed description of the disclosure given below.

According to an embodiment, a display device includes patterns below the sealing member for compensating the stepped portion, in addition to the voltage wiring portion (e.g., voltage wiring pattern) and the metal wiring portions for connecting the display pads. The patterns may be arranged as additional dummy patterns or may be connected with the metal wiring portion, so that the stepped portion formed by the wirings below the sealing member can be minimized in the non-display area. Accordingly, reducing or effectively preventing a stain of the display device that may occur due to the stepped portion of the sealing member, is possible.

The effects of the invention are not limited to the aforementioned effects, and various other effects are included in the specification.

According to an embodiment, a display device includes a display panel including a display area, a non-display area and a pad area in order along a first direction, a voltage wiring pattern which is in the non-display area and connected to the display area, and between the pad area and the voltage wiring pattern along the first direction, a metal wiring pattern which is in the non-display area and connects the pad area to the voltage wiring pattern, an encapsulation substrate facing the display panel, and a sealing member which is in the non-display area, between the pad area and the voltage wiring pattern, and couples the display panel and the encapsulation substrate to each other. The metal wiring pattern includes in order along the first direction from the pad area to the voltage wiring pattern a lead-in portion connected to the pad area, an overlapping portion which overlaps the sealing member, and a connection portion connecting the overlapping portion to the voltage wiring pattern, and the overlapping portion includes in order along a second direction crossing the first direction a first portion corresponding to the lead-in portion, a second portion corresponding to the connection portion, and a third portion extending from the second portion in a direction away from the first portion.

A portion of the voltage wiring pattern may be between the display area and the sealing member, the third portion of the metal wiring pattern may be spaced apart from the portion of the voltage wiring pattern, and a first space may be defined between the third portion of the metal wiring pattern and the voltage wiring pattern at which the sealing member is exposed from the metal wiring pattern.

Within the metal wiring pattern, the lead-in portion may be provided in plural including a plurality of lead-in portions spaced apart from each other along the second direction, the connection portion may be provided in plural including a plurality of connection portions spaced apart from each other along the second direction, a first gap may be defined between the plurality of lead-in portions, and a second gap may be defined between the plurality of connection portions. The first gap may be larger than the second gap.

The metal wiring pattern may be spaced apart from the voltage wiring pattern at the first portion of the metal wiring pattern, and the lead-in portion and the connection portion may be misaligned with each other.

Each of the first portion and the third portion of the metal wiring pattern may have an upper side which is closest to the voltage wiring pattern, and the upper side of the first portion and the upper side of the third portion may be spaced apart from each other.

Within the metal wiring pattern, the second portion may be provided in plural including a plurality of second portions respectively corresponding to the plurality of connection portions, and the third portion may be between the plurality of second portions.

A second space may be defined between the first portion of the metal wiring pattern and the voltage wiring pattern at which the sealing member is exposed from the metal wiring pattern, and the first space may be equal to the second space.

The portion of the voltage wiring pattern which is between the display area and the sealing member may overlap the sealing member by a width of the voltage wiring pattern, each of the sealing member and the third portion of the metal wiring pattern may have a width, and the width of the sealing member may be greater than a sum of the width of the voltage wiring pattern and the width of the third portion of the metal wiring pattern.

The metal wiring pattern may be provided in plural including a first metal wiring pattern and a second metal wiring pattern, each of the first metal wiring pattern and the second metal wiring pattern may include the lead-in portion, the connection portion and the overlapping portion, the third portion of the first metal wiring pattern and the third portion of the second metal wiring pattern may be spaced apart from each other, the voltage wiring pattern may include a center, and the first metal wiring pattern and the second metal wiring pattern may be symmetrical with respect to the center of the voltage wiring pattern.

The display device may further include a conductive pattern between the third portion of the first metal wiring pattern and the third portion of the second metal wiring pattern, and the conductive pattern may be spaced apart from both the third portion of the first metal wiring pattern and the third portion of the second metal wiring pattern.

The display panel may further include a first conductive layer including the conductive pattern, and a second conductive layer including both the first metal wiring pattern and the second metal wiring pattern, and the second conductive layer may be between the sealing member and the first conductive layer.

The display panel may further include a plurality of fan-out lines extending from the pad area to the sealing member, a first conductive layer including the plurality of fan-out lines, and a second conductive layer including the metal wiring pattern, and the plurality of fan-out lines of the first conductive layer may face the sealing member with the metal wiring pattern of the second conductive layer therebetween.

The display device may further include a plurality of first voltage lines branched from the voltage wiring pattern and spaced apart from each other in the display area.

The metal wiring pattern may be in direct contact with the voltage wiring pattern.

According to an embodiment, a display device includes a display panel including a display area, a non-display area and a pad area in order along a first direction, a voltage wiring pattern which is in the non-display area and connected to the display area, and between the pad area and the voltage wiring pattern along the first direction, a metal wiring pattern which connects the pad area to the voltage wiring pattern, an encapsulation substrate facing the display panel, and a sealing member which is in the non-display area, between the pad area and the voltage wiring pattern, and couples the display panel and the encapsulation substrate to each other. The metal wiring pattern includes in order along the first direction from the pad area to the voltage wiring pattern, a lead-in portion connected to the pad area, an overlapping portion which overlaps the sealing member, and a connection portion connecting the overlapping portion to the voltage wiring pattern, and the overlapping portion includes in order along a second direction crossing the first direction a first portion corresponding to the lead-in portion, a second portion corresponding to the connection portion, and a dummy pattern which is disconnected from and adjacent to the second portion.

The metal wiring pattern may be provided in plural including a first metal wiring pattern and a second metal wiring pattern spaced apart from each other along the second direction, each of the first metal wiring pattern and the second metal wiring pattern may include the first portion and the second portion of the overlapping portion, and along the second direction, the dummy pattern may be between the second portion of the first metal wiring pattern and the second portion of the second metal wiring pattern.

The dummy pattern of the overlapping portion may be provided in plural including a first dummy pattern and a second dummy pattern disconnected from and spaced apart from each other along the second direction, and along the first direction each of the sealing member, the first dummy pattern and the second dummy pattern may have a width, each of the first dummy pattern and the second dummy pattern may be disconnected from and spaced apart from the voltage wiring pattern, and the width of each of the first dummy pattern and the width of the second dummy pattern may be smaller than the width of the sealing member.

The first portion, the second portion and the dummy pattern may be respective portions of a same material layer.

The display panel may further include a passivation layer between the dummy pattern, and each of the first portion and the second portion, respectively.

The dummy pattern may be provided in plural including a first dummy pattern and a second dummy pattern disconnected from and spaced apart from each other along the second direction, and the display panel may further include along the second direction, a conductive pattern which is disconnected from the metal wiring pattern and between and spaced apart from both the first dummy pattern and the second dummy pattern.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
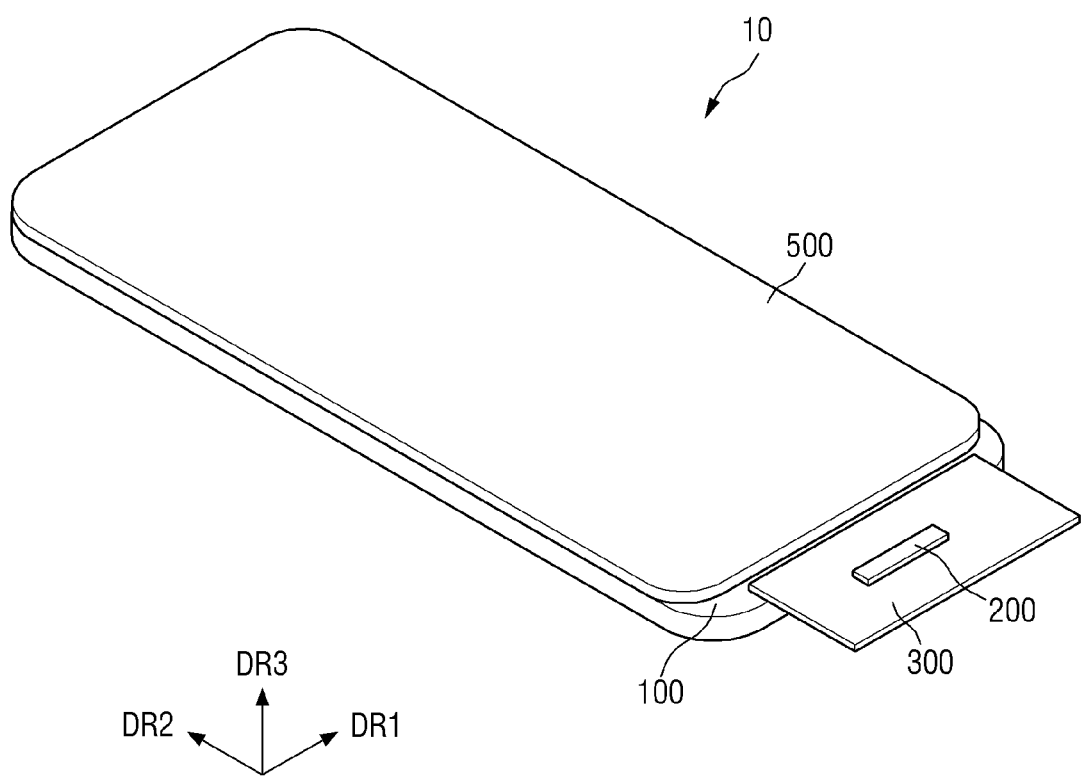
FIG. 1 is a perspective view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no other layer or substrate, or intervening layers are present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross-section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the drawings.

Figure 2:
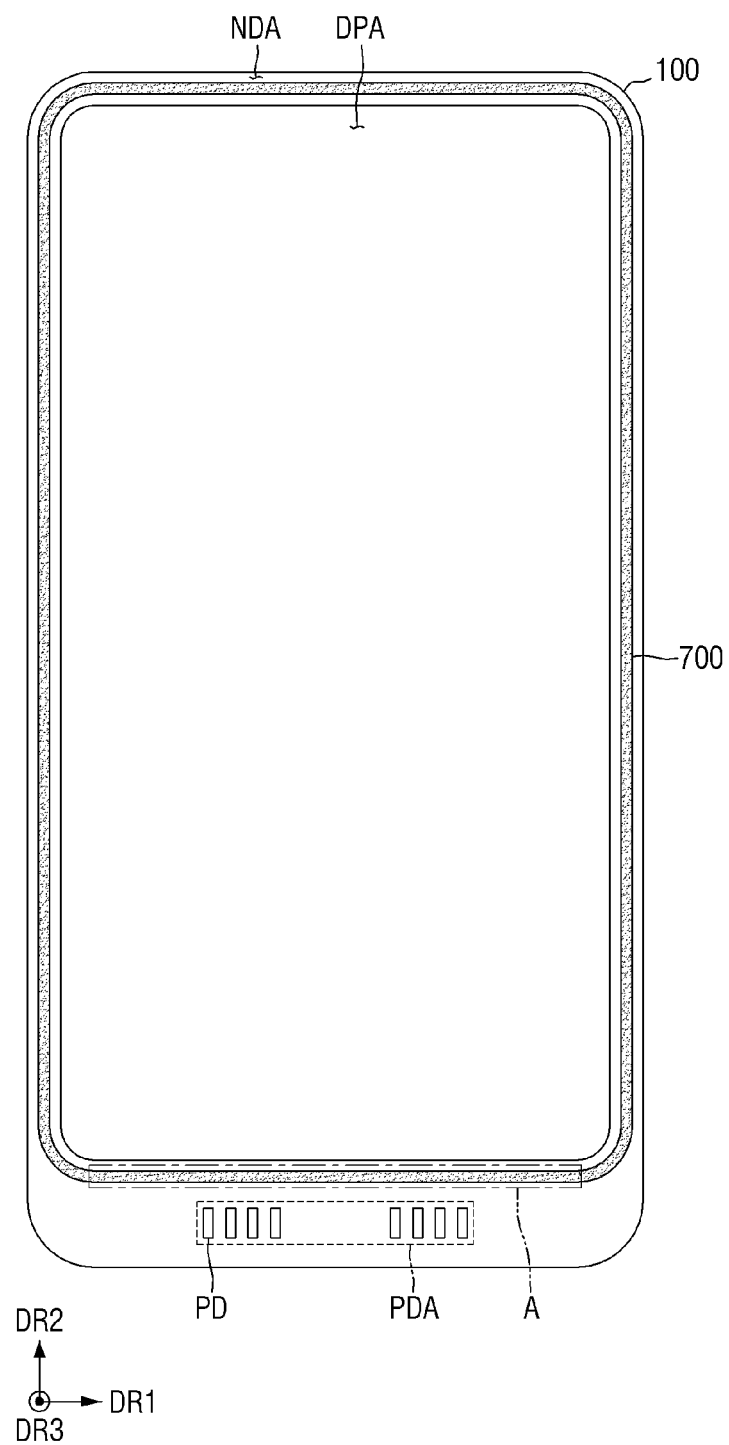
FIG. 2 is a schematic plan view of an embodiment of a display panel of FIG. 1.
Figure 3:
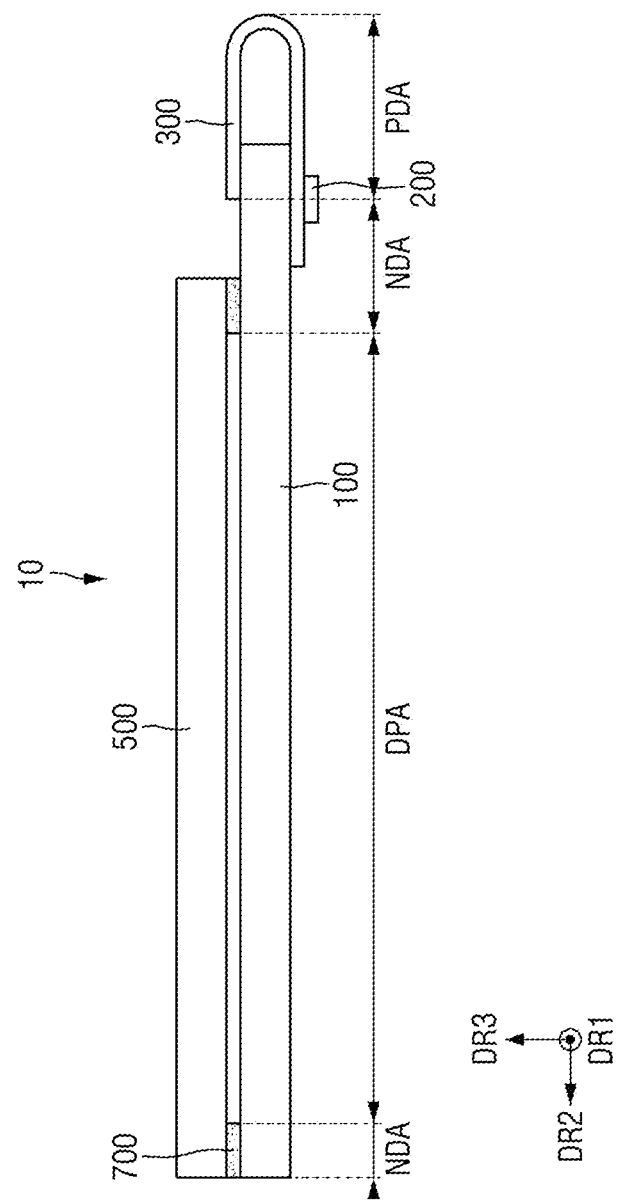
FIG. 3 is a side view of the display device of FIG. 1.

FIG. 1 is a perspective view of an embodiment of a display device 10. FIG. 2 is a schematic plan view of an embodiment of a display panel 100 of FIG. 1. FIG. 3 is a cross-sectional side view of the display device 10 of FIG. 1. In FIG. 2, the illustration of an encapsulation substrate 500 of a display device 10 is omitted and only the schematic arrangement of a display panel 100 and a sealing member 700 is illustrated.

In the specification, a first direction DR1 may be a direction parallel to a short side of the display device 10 in a plan view, for example, a horizontal direction of the display device 10. A second direction DR2 may be a direction parallel to a long side of the display device 10 in a plan view, for example, a vertical direction of the display device 10. A third direction DR3 may be a thickness direction of the display device 10. In addition, the first direction DR1 may indicate a right side when the display device 10 is viewed from the third direction DR3, and an opposite direction to the first direction DR1 may indicate a left side. The second direction DR2 may be an upper side when the display device 10 is viewed from the third direction DR3, and an opposite direction to the second direction DR2 may be a lower side. The third direction DR3 may be an upward direction, and an opposite direction to the third direction DR3 may be a downward direction.

Referring to FIGS. 1 to 3, the display device 10 may be applied to a variety of electronic apparatuses, e.g., medium-sized or small-sized electronic devices such as a tablet personal computer ("PC"), a smartphone, a car navigation unit, a camera, a center information display ("CID") provided in a vehicle, a wristwatch-type electronic device, a personal digital assistant ("PDA"), a portable multimedia player ("PMP") and a game console, and medium and large electronic devices such as a television, an external billboard, a display monitor, a personal computer and a laptop computer. These are merely suggested as examples, but the display device 10 may also be applied to other electronic devices without departing from the scope of the disclosure.

The display device 10 may be a light emitting display device such as a liquid crystal display, an organic light emitting display using an organic light emitting diode, a quantum dot light emitting display including a quantum dot light emitting layer, an inorganic light emitting display including an inorganic semiconductor, and a micro light emitting display using a micro light emitting diode ("LED"). In the following description, the display device 10 is described with reference to an organic light emitting display device, but the disclosure is not limited thereto.

The display device 10 includes the display panel 100 (or a first substrate), a display driver 200, the display circuit board 300, the encapsulation substrate 500 (or a second substrate), and a sealing member 700.

The display panel 100 may be provided or formed in a rectangular shape, in a plan view, having short sides extended along the first direction DR1 and long sides extended along the second direction DR2 which crosses the first direction DR1. A corner where the short side along the first direction DR1 and the long side along the second direction DR2 meet each other, may be rounded or right-angled in the plan view. The planar shape of the display panel 100 is not limited to a rectangular shape, and may be provided or formed in other polygonal shapes, a circular shape or elliptical shape.

The display panel 100 may be provided or formed to be flat, but is not limited thereto. In an embodiment, for example, the display panel 100 may include a curved portion provided or formed at left and right sides thereof and having a curvature or a varying curvature. In addition, the display panel 100 may be provided or formed flexibly such that the display panel 100 is bendable, foldable or rollable.

The display panel 100 may include a display area DPA and a non-display area NDA. The display area DPA is a planar area where an image is displayed, and the non-display area NDA is an area where an image is not displayed. The display area DPA may also be referred to as an active region, and the non-display area NDA may also be referred to as a non-active region. The display area DPA may substantially occupy the center of the display panel 100.

The display area DPA may include a pixel PX provided in plural including a plurality of pixels PX. The plurality of pixels PX may be arranged in a matrix. The shape of each of the pixels PX may be a rectangular or square shape in a plan view. However, the disclosure is not limited thereto, and the shape of each of the pixels PX may be a rhombic shape in which each side is inclined with respect to one direction. The pixels PX may be alternately arranged in a stripe type or a pentile type. In addition, each of the pixels PX may include one or more of a light emitting element EL (in FIG. 6) that generates and/or emits light of a wavelength band to display a corresponding color.

The non-display area NDA is adjacent to the display area DPA. In an embodiment, the non-display area NDA may be disposed around the display area DPA in a plan view. The non-display area NDA may completely or partially surround the display area DPA in the plan view. The display area DPA may have a rectangular shape, and the non-display area NDA may be disposed adjacent to each of four sides of the display area DPA to define a plurality of non-display areas NDA. The non-display areas NDA may form or define a bezel of the display panel 100. Wirings or circuit drivers included in the display panel 100 may be disposed in each of the non-display areas NDA, or external devices may be mounted thereon.

The display driver 200 outputs electrical signals and voltages for driving the display panel 100. In an embodiment, for example, the display driver 200 may supply data voltages as the electrical signals, to data lines DL. Further, the display driver 200 may supply driving voltages as the electrical signals to driving voltage lines and may supply scan control signals as the electrical signals, to a scan driver. The display driver 200 may be provided or formed as an integrated circuit ("IC") and attached onto the display circuit board 300. Alternatively, the display driver 200 may be attached to the display panel 100 by a chip on glass ("COG") method, a chip on plastic ("COP") method or an ultrasonic bonding method. Although it is illustrated in the drawing that the display driver 200 is provided or formed as one of the integrated circuit, the disclosure is not limited thereto. The integrated circuit may supply electrical signals such as a data voltage, and a scan control signal or a driving voltage as electrical signals may be applied by an additional display driver. In an embodiment, for example, the display driver 200 that provides the scan control signal or the driving voltage may be provided or formed on the display circuit board 300, or may be provided by a printed circuit board ("PCB") connected to the display circuit board 300.

The display circuit board 300 may be disposed in the non-display area NDA at one edge of the display panel 100. In an embodiment, for example, the display circuit board 300 may be disposed in the non-display area NDA at the lower edge of the display panel 100. The display circuit board 300 may be bendable along a side of the display panel 100 and to the bottom of the display panel 100 (in FIG. 3). The display circuit board 300 which is bent may dispose an end of the display circuit board 300 at the bottom surface of the display panel 100 and the end may be attached to the bottom surface of the display panel 100. Although not illustrated, the display circuit board 300 may be attached to and fixed to the bottom surface of the display panel 100 through an adhesive member. The adhesive member may be a pressure-sensitive adhesive. Alternatively, the display circuit board 300 may be omitted, and an end of the display panel 100 may be bent downward.

The display circuit board 300 may be attached to display pads PD of the display panel 100 using an anisotropic conductive film. Thus, the display circuit board 300 may be electrically connected to the display panel 100 at the display pads PD of the display panel 100. The display circuit board 300 may be a flexible film, such as a flexible printed circuit board, a printed circuit board or a chip on film.

The encapsulation substrate 500 is disposed above the display panel 100. In an embodiment, for example, the encapsulation substrate 500 may be disposed to face and be spaced apart from the display panel 100 along the third direction DR3. The encapsulation substrate 500 may have a planar area smaller than a planar area of the display panel 100, and may be disposed to cover at least the display area DPA of the display panel 100. However, the disclosure is not limited thereto, and the planar area of the encapsulation substrate 500 may be substantially the same as a planar area of the display panel 100. The encapsulation substrate 500 may encapsulate the light emitting elements EL and the circuit elements disposed on the display panel 100, in cooperation with the sealing member 700 to be described later. In addition, in embodiments, a touch member, a polarizing member, or the like may be further disposed on the encapsulation substrate 500.

In an embodiment, the encapsulation substrate 500 may be a transparent plate or a transparent film. In an embodiment, for example, the encapsulation substrate 500 may include a glass material, a quartz material or the like. In an embodiment, the encapsulation substrate 500 and the light emitting element EL may be spaced apart from each other to define a separation space, and an inert gas such as nitrogen gas may be filled therebetween. However, the disclosure is not limited thereto, and a filler or the like may be filled in the separation space between the encapsulation substrate 500 and the light emitting element EL.

The sealing member 700 may be disposed between the display panel 100 and the encapsulation substrate 500. In an embodiment, for example, the sealing member 700 may be disposed in the non-display area NDA of the display panel 100 to surround the display area DPA. The sealing member 700 may encapsulate the light emitting elements EL and circuit elements of the display panel 100, together with the encapsulation substrate 500. The sealing member 700 may encapsulate a space between the encapsulation substrate 500 and the display panel 100, and the space may be maintained in a vacuum state in which moisture or air is removed therefrom, such as during a manufacturing process of the display device 10. The sealing member 700 may reduce or effectively prevent damage to the light emitting element EL due to air, moisture or the like, in cooperation with the encapsulation substrate 500. The sealing member 700 may couple the display panel 100 to the encapsulation substrate 500.

In an embodiment, the sealing member 700 may be a hardened frit. As used herein, the term "frit" may refer to a structure having glass properties provided or formed by melting and hardening glass powder to which an additive is selectively added. A frit for bonding the display panel 100 and the encapsulation substrate 500 to each other may be provided or formed by placing the glass powder between the display panel 100 and the encapsulation substrate 500 and performing a sintering and melting process. Hereinafter, the sealing member 700 as a hardened frit will be described by way of example.

Figure 4:
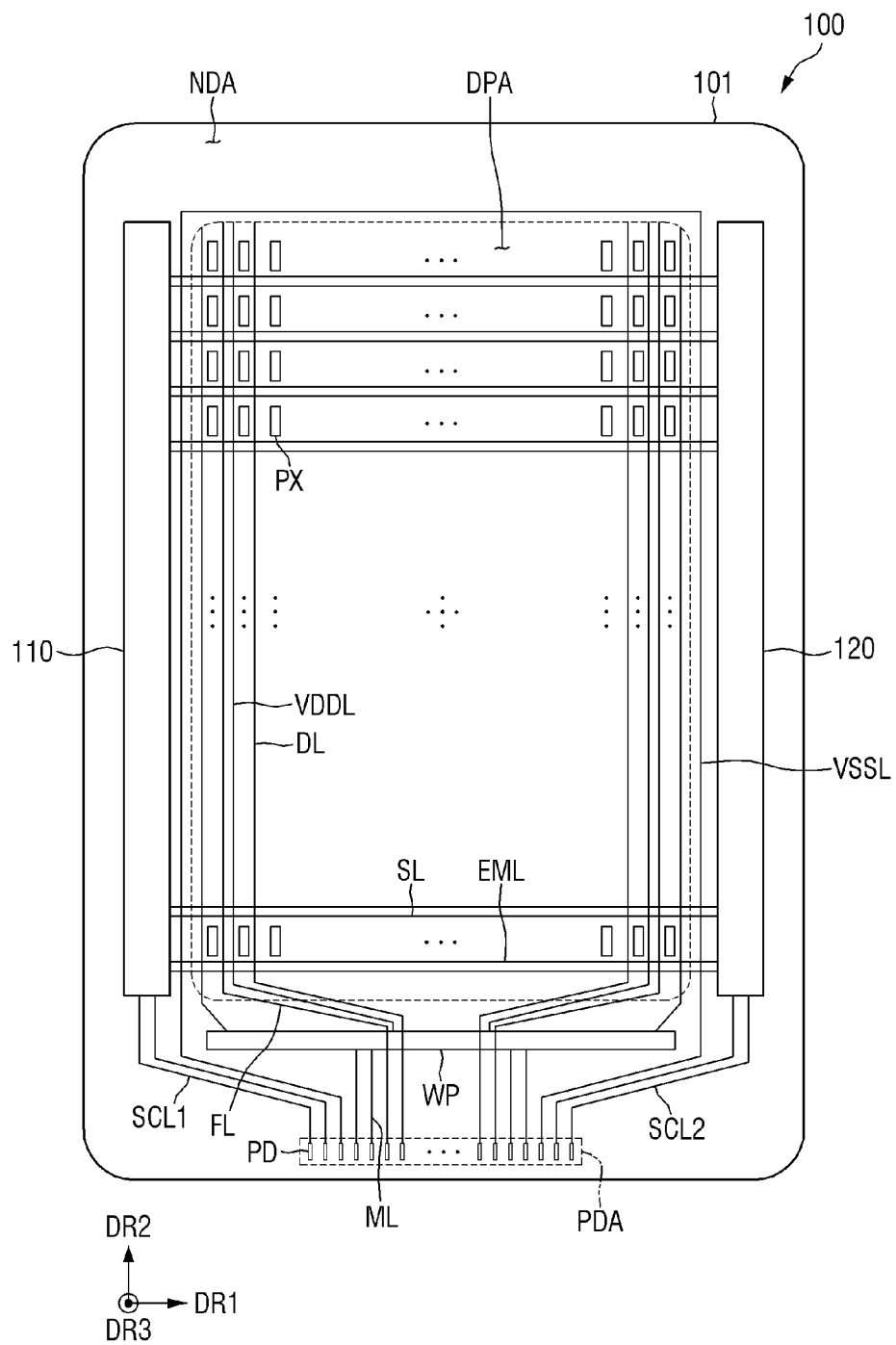
FIG. 4 is a plan view showing a schematic arrangement of an embodiment of wirings of a display panel of a display device.

FIG. 4 is a plan view showing an embodiment of an arrangement of wirings disposed on a display panel 100 of a display device 10.

In FIG. 4, for simplicity of description, only pixels PX, scan lines SL, emission control lines EML, data lines DL, first scan control lines SCL1, second scan control lines SCL2, a first scan driver 110, a second scan driver 120, the display driver 200, display pads PD, fan-out lines FL, a first voltage line VDDL, a second voltage line VSSL, and a voltage wiring portion WP (e.g., voltage wiring pattern) of the display panel 100 are illustrated.

Referring to FIG. 4, the display panel 100 may include a display area DPA where pixels PX are provided or formed to display an image, and a non-display area NDA that is a peripheral area relative to the display area DPA. The non-display area NDA may be a planar area from the boundary of the display area DPA to the edge of the display panel 100. The scan lines SL, the data lines DL, the emission control lines EML and the pixels PX may be disposed in the display area DPA. The scan lines SL and the emission control lines EML may be provided or formed in parallel along in the first direction DR1, and the data lines DL may be provided or formed in parallel along the second direction DR2 which intersects the first direction DR1. Also, the first voltage line VDDL may also be disposed in the display area DPA and may extend along the second direction DR2.

Each of the pixels PX may be connected to a scan line SL among the scan lines SL, an emission control line EML among the emission control lines EML, a data line DL among the data lines DL, and the first voltage line VDDL. Further, each of the pixels PX may be electrically connected to the second voltage line VSSL. Each of the pixels PX may include thin film transistors including a driving transistor and at least one switching transistor, an organic light emitting diode, and a capacitor. Each of the pixels PX may receive a data voltage of the data line DL when a scan signal is applied from the scan line SL, and supply an electrical driving current to the organic light emitting diode according to the data voltage applied to the gate electrode of the driving transistor, thereby emitting light. The structure of the elements disposed in the pixel PX will be described in detail later with reference to FIG. 6.

The first scan driver 110, the second scan driver 120, the display driver 200, the first scan control lines SCL1, the second scan control lines SCL2, the fan-out lines FL, the second voltage line VSSL and the voltage wiring portion WP may be disposed in the non-display area NDA.

The first scan driver 110 is connected to the display driver 200 through a first scan control line SCL1 provided in plural including the first scan control lines SCL1. Thus, the first scan driver 110 may receive a first scan control signal of the display driver 200. The first scan driver 110 generates scan signals according to the first scan control signal and supplies the scan signals to the scan lines SL.

The second scan driver 120 is connected to the display driver 200 through a second scan control line SCL2 provided in plural including the second scan control lines SCL2. Thus, the second scan driver 120 may receive a second scan control signal of the display driver 200. The second scan driver 120 generates scan signals according to the second scan control signal and supplies the scan signals to the scan lines SL.

The first scan driver 110 may be connected to the scan lines SL connected to the pixels PX of the display area DPA. The second scan driver 120 may be connected to the scan lines SL connected to the pixels PX.

A fan-out line FL provided in plural including the fan-out lines FL connects the display pads PD to the data lines DL, the first scan driver 110 and the second scan driver 120. That is, the fan-out lines FL may be disposed between the display pads PD and the data lines DL, between the display pads PD and the first scan driver 110, and between the display pads PD and the second scan driver 120.

The second voltage line VSSL may be disposed between the display area DPA (dotted line in FIG. 4), and each of the scan drivers 110 and 120, respectively, while being connected to the display pads PD. The second voltage line VSSL may extend along both the first direction DR1 and the second direction DR2 to substantially surround the display area DPA. However, the disclosure is not limited thereto.

The voltage wiring portion WP may be connected to the display pads PD and the first voltage line VDDL. The voltage wiring portion WP may transmit source voltages applied from the display pads PD to the first voltage line VDDL, and the first voltage line VDDL may apply the first source voltages to the pixels PX of the display area DPA. In an embodiment, the first voltage lines VDDL may be branched from the voltage wiring portion WP along the second direction DR2 while being spaced apart from each other. The voltage wiring portion WP and the fan-out lines FL may be provided or formed as different conductive layers and partially overlap each other along the third direction DR3 (refer to FIG. 9). However, the disclosure is not limited thereto.

A pad area PDA may include a display pad PD provided in plural including the display pads PD. The pad area PDA may be disposed at one edge of the display panel 100. Referring to FIG. 4, for example, the pad area PDA may be disposed at the lower edge of the display panel 100.

Figure 5:
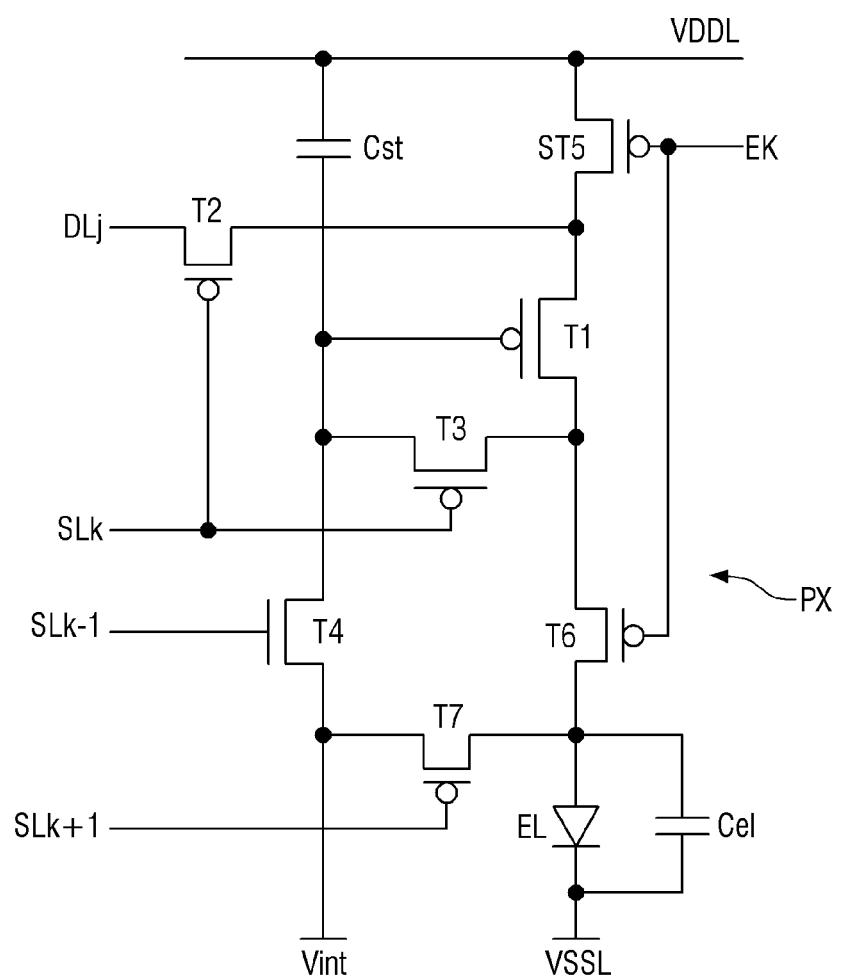
FIG. 5 is an equivalent circuit diagram of an embodiment of a pixel of a display device.

FIG. 5 is an equivalent circuit diagram of an embodiment of a pixel PX of a display device 10.

Referring to FIG. 5, the pixel PX may be connected to a $k-1^{th}$ scan line SLk−1, a $k^{th}$ scan line SLk, a $k+1^{th}$ scan line SLk+1 (k being a positive integer), and a $j^{th}$ data line DLj (j being a positive integer). Further, each of the pixels PX may be connected to the first voltage line VDDL to which the first source voltage is applied, the second voltage line VSSL to which the second source voltage is applied, and an initialization voltage line Vint to which an initialization voltage is applied.

According to an embodiment, each of the pixels PX may include a light emitting element EL, first to seventh transistors T1 to T7, and a first capacitor Cst. FIG. 5 illustrates that the pixel PX has a 7T1C (7Transistor-1Capacitor) structure including the first to seventh transistors T1 to T7 and one of the first capacitor Cst. However, the disclosure is not limited thereto, and each pixel PX may include a larger number of transistors or capacitors.

Although FIG. 5 illustrates that the first to seventh transistors T1 to T7 are provided or formed as PMOS transistors, the disclosure is not limited thereto. In an embodiment, for example, the first to seventh transistors T1 to T7 may be provided or formed as NMOS transistors. Alternatively, a first portion of the first to seventh transistors T1 to T7 may be provided or formed as PMOS transistors and a second portion as remaining transistors among the first to seventh transistors T1 to T7 may be provided or formed as NMOS transistors. The PMOS transistor is turned on by a gate on voltage lower than a gate off voltage, and the NMOS transistor is turned on by the gate on voltage higher than the gate off voltage.

The light emitting element EL may generate and/or emit light according to an electrical driving current (Id) of the first transistor T1. The luminance of the light emitting element EL may be proportional to the driving current (Id).

The light emitting element EL may be an organic light emitting diode including a first electrode, a second electrode, and an organic light emitting layer disposed between the first electrode and the second electrode. Alternatively, the light emitting element EL may be an inorganic light emitting diode including a first electrode, a second electrode, and an inorganic semiconductor disposed between the first electrode and the second electrode. Alternatively, the light emitting element EL may be a micro light emitting diode or a quantum dot light emitting diode including a first electrode, a second electrode, and a quantum dot light emitting layer disposed between the first electrode and the second electrode.

The first electrode of the light emitting element EL may be connected to the second electrode of the fifth transistor T5 and the first electrode of the seventh transistor T7, and the second electrode of the light emitting element EL may be connected to the second voltage line VSSL. A parasitic capacitance (Cel) may be formed between the first electrode and the second electrode of the light emitting element EL.

The first transistor T1 may control a drain-source current (hereinafter, referred to as "driving current" (Id)) based on a data voltage applied to the gate electrode. The driving current (Id) flowing through the channel of the first transistor T1 is proportional to a square of a difference between a threshold voltage and a voltage (Vgs) between the gate electrode and the first electrode.

The second transistor T2 is turned on by a scan signal of the $k^{th}$ scan line SLk to connect the first electrode of the first transistor T1 to the $j^{th}$ data line DLj. The gate electrode of the second transistor T2 may be connected to the $k^{th}$ scan line SLk, the first electrode of the second transistor T2 may be connected to the first electrode of the first transistor T1, and the second electrode of the second transistor T2 may be connected to the data line DLj.

The third transistor T3 is turned on by the scan signal of the $k^{th}$ scan line SLk to connect the gate electrode and the second electrode of the first transistor T1. In other words, when the third transistor T3 is turned on, the gate electrode and the second electrode of the first transistor T1 are connected and, thus, the first transistor T1 is driven by a diode. The gate electrode of the third transistor T3 may be connected to the $k^{th}$ scan line SLk, the first electrode of the third transistor T3 may be connected to the second electrode of the first transistor T1, and the second electrode of the third transistor T3 may be connected to the gate electrode of the first transistor T1.

The fourth transistor T4 is turned on by the scan signal of the $k-1^{th}$ scan line SLk−1 to connect the gate electrode of the first transistor T1 and the initialization voltage line Vint. The gate electrode of the first transistor T1 may be discharged to the initialization voltage of the initialization voltage line Vint. The gate electrode of the fourth transistor T4 may be connected to the $k-1^{th}$ scan line SLk−1, the first electrode of the fourth transistor T4 may be connected to the gate electrode of the first transistor T1, and the second electrode of the fourth transistor T4 may be connected to the initialization voltage line Vint.

The fifth transistor T5 is turned on by the emission control signal of the $k^{th}$ emission line Ek to connect the first electrode of the first transistor T1 and the first voltage line VDDL. The gate electrode of the fifth transistor T5 may be connected to the $k^{th}$ emission line Ek, the first electrode of the fifth transistor T5 may be connected to the first voltage line VDDL, and the second electrode of the fifth transistor T5 may be connected to the first electrode of the first transistor T1.

The sixth transistor T6 is connected between the second electrode of the first transistor T1 and the first electrode of the light emitting element EL. The sixth transistor T6 may be turned on by the emission control signal of the $k^{th}$ emission line Ek to connect the second electrode of the first transistor T1 to the first electrode of the light emitting element EL. The gate electrode of the sixth transistor T6 is connected to the $k^{th}$ emission line Ek, the first electrode of the sixth transistor T6 is connected to the second electrode of the first transistor T1, and the second electrode of the sixth transistor T6 is connected to the first electrode of the light emitting element EL. When both of the fifth transistor T5 and the sixth transistor T6 are turned on, the driving current (Id) may be supplied to the light emitting element EL.

The seventh transistor T7 may be turned on by the scan signal of the $k+1^{th}$ scan line SLk+1 to connect the first electrode of the light emitting element EL and the initialization voltage line Vint. The first electrode of the light emitting element EL may be discharged to an initialization voltage. The gate electrode of the seventh transistor T7 is connected to the $k+1^{th}$ scan line SLk+1, the first electrode of the seventh transistor T7 is connected to the first electrode of the light emitting element EL, and the second electrode of the seventh transistor T7 is connected to the initialization voltage line Vint.

The first capacitor Cst is formed between the gate electrode of the first transistor T1 and the first voltage line VDDL. One electrode among two electrodes of the first capacitor Cst may be connected to the gate electrode of the first transistor T1, and the other electrode of the first capacitor Cst may be connected to the first voltage line VDDL. The first capacitor Cst may serve to maintain the voltage of the gate electrode of the first transistor T1 for one frame period.

In an embodiment, when the first electrode of each transistor is a source electrode, the second electrode thereof may be a drain electrode. When the first electrode of each transistor is a drain electrode, the second electrode thereof may be a source electrode.

Figure 6:
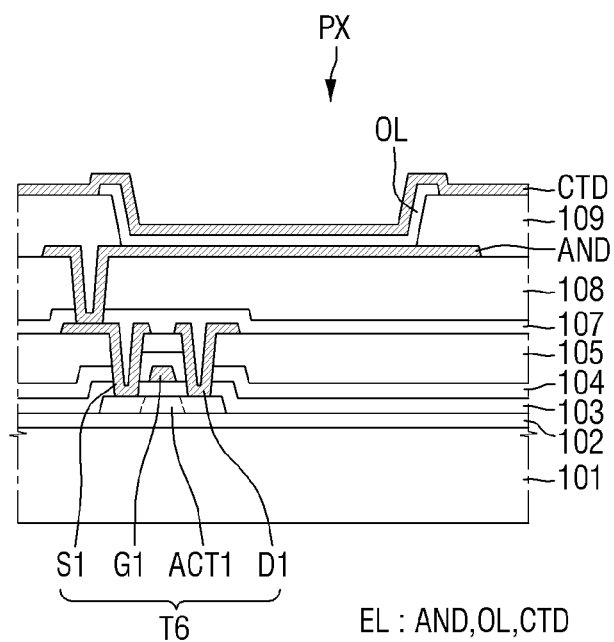
FIG. 6 is a cross-sectional view showing an embodiment of the pixel of FIG. 4.

FIG. 6 is an enlarged cross-sectional view showing a pixel PX of FIG. 4.

Referring to FIG. 6, the display panel 100 may include a base substrate 101, and a transistor (sixth transistor T6 in FIG. 5) and a light emitting element EL disposed on the base substrate 101. Each of the pixels PX of the display panel 100 may include at least one transistor and the light emitting element EL, and may be connected to a corresponding one of the scan line SL and a corresponding one of the data line DL. Although it is illustrated in the drawing that only the sixth transistor T6 is disposed in the pixel PX, the disclosure is not limited thereto.

The base substrate 101 may be a rigid substrate. The base substrate 101 may including or be formed of an insulating material such as glass, quartz, or a polymer resin. Examples of a polymer material may include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof. The base substrate 101 may include a metal material.

A buffer layer 102 may be disposed on the base substrate 101. The buffer layer 102 may be provided or formed on the base substrate 101 to protect the transistors and the light emitting elements EL from moisture penetrating through the base substrate 101 susceptible to moisture permeation. The buffer layer 102 may include or be formed of a plurality of inorganic layers that are stacked on the base substrate 101. In an embodiment, for example, the buffer layer 102 may be provided or formed of a multilayer film in which one or more inorganic materials of silicon oxide (SiOx), silicon nitride (SiNx), and silicon oxynitride (SiON) are alternately stacked. In an embodiment, the buffer layer 102 may be omitted.

A plurality of transistors are disposed on the buffer layer 102. Each transistor may include an active layer ACT1, a gate G1 (e.g., a gate electrode), a source S1 (e.g. a source electrode), and a drain D1 (e.g., drain electrode). Although FIG. 6 illustrates that the sixth transistor T6 is provided or formed by a top gate method in which the gate G1 is located above the active layer ACT1, the disclosure is not limited thereto. That is, the transistors may be provided or formed by a bottom gate method in which the gate G1 is located below the active layer ACT1, or a double gate method in which the gate G1 is located both above and below the active layer ACT1.

The active layer ACT1 is disposed on the buffer layer 102. The active layer ACT1 may include or be formed of a silicon-based semiconductor material or an oxide-based semiconductor material. Although not shown, a light blocking layer may be provided or formed between the buffer layer 102 and the active layer ACT1 to block external light incident on the active layer ACT1.

A gate insulating layer 103 may be disposed on the active layer ACT1. The gate insulating layer 103 may include or be formed of an inorganic film, for example, a multilayer film in which one or more inorganic materials of silicon oxide (SiOx), silicon nitride (SiNx), and silicon oxynitride (SiON) are alternately stacked.

A first conductive layer including a gate G1 and a gate line may be disposed on the gate insulating layer 103. The gate G1 and the gate line may be provided or formed as a single layer or multiple layers including any one of molybdenum (Mo), aluminum (Al), chromium (Cr), gold (Au), titanium (Ti), nickel (Ni), neodymium (Nd) and copper (Cu) and an alloy thereof.

A first interlayer insulating layer 104 may be provided or formed on the first conductive layer. The first interlayer insulating layer 104 may include or be formed of an inorganic film, for example, a multilayer film in which one or more inorganic materials of silicon oxide (SiOx), silicon nitride (SiNx), and silicon oxynitride (SiON) are alternately stacked. The first interlayer insulating layer 104 may extend to another area, e.g., the non-display area NDA, from the display area DPA.

A second interlayer insulating layer 105 may be provided or formed on the first interlayer insulating layer 104. The second interlayer insulating layer 105 may be formed of an inorganic film, for example, a multilayer film in which one or more inorganic materials of silicon oxide (SiOx), silicon nitride (SiNx), and silicon oxynitride (SiON) are alternately stacked. The second interlayer insulating layer 105 may extend to another area, e.g., the non-display area NDA, from the display area DPA.

A second conductive layer disposed in another area, e.g., the non-display area NDA, may be disposed between the first interlayer insulating layer 104 and the second interlayer insulating layer 105. Referring to FIG. 4, in a plan view, the plurality of fan-out lines FL may be disposed in a lower non-display area NDA as a lower side portion of the non-display area NDA which is between the pad area PDA and the display area DPA, and the fan-out lines FL may include or be formed as portions of the first conductive layer and portions of the second conductive layer, without being limited thereto.

A third conductive layer including a source S1, a drain D1, and a data line DL may be disposed on the second interlayer insulating layer 105. Each of the source S1 and the drain D1 may be connected to the active layer ACT1 via a contact hole extended through a thickness of the gate insulating layer 103, the first interlayer insulating layer 104 and the second interlayer insulating layer 105. The source S1, the drain D1, and the data line DL may be provided or formed as a single layer or multiple layers including any one of molybdenum (Mo), aluminum (Al), chromium (Cr), gold (Au), titanium (Ti), nickel (Ni), neodymium (Nd) and copper (Cu) and an alloy thereof.

A passivation layer 107 for insulating transistors may be provided or formed on the third conductive layer. The passivation layer 107 may include or be formed of an inorganic film, for example, a multilayer film in which one or more inorganic materials of silicon oxide (SiOx), silicon nitride (SiNx), and silicon oxynitride (SiON) are alternately stacked.

A planarization layer 108 is disposed on the passivation layer 107. The planarization layer 108 may flatten the stepped portion of the passivation layer 107 formed by the profile of the underlying transistors. The planarization layer 108 may include be formed of an organic layer such as acryl resin, epoxy resin, phenolic resin, polyamide resin, polyimide resin and the like.

A pixel defining layer 109 and the light emitting element EL are disposed on the planarization layer 108.

The light emitting element EL may be an organic light emitting element. As the organic light emitting element, the light emitting element EL may include an anode electrode AND, a light emitting layer OL, and a cathode electrode CTD.

The anode electrode AND may be provided or formed on the planarization layer 108. The anode electrode AND may be connected to the source S1 of the sixth transistor T6 via a contact hole extended through respective thicknesses the passivation layer 107 and the planarization layer 108.

The pixel defining layer 109 may be provided or formed to cover the edge of the anode electrode AND on the planarization layer 108 to partition the pixels PX. That is, the pixel defining layer 109 serves to define the pixels PX. Each of the pixels PX represents a region where the anode electrode AND, the light emitting layer OL and the cathode electrode CTD are stacked sequentially in a direction away from the base substrate 101, and holes from the anode electrode AND electrons from the cathode electrode CTD are coupled to each other in the light emitting layer OL to emit light. The pixel defining layer 109 may define an opening at which the anode electrode AND is exposed outside of the pixel defining layer 109. The opening may correspond to a light emission area of the pixel PX, and a remaining area of the pixel PX may correspond to a non-light emission area of the pixel PX.

The light emitting layer OL is provided or formed on the anode electrode AND the pixel defining layer 109. The light emitting layer OL may be an organic light emitting layer. The light emitting layer OL may emit one of red light, green light and blue light. Alternatively, the light emitting layer OL may be a white light emitting layer that emits white light. As emitting white light, the light emitting layer OL may have a structure in which a red light emitting layer, a green light emitting layer and a blue light emitting layer are stacked, and may be a common layer provided or formed commonly to the pixels PX. Where the light emitting layer OL is a layer provided commonly to each of the pixels PX, the display panel 100 may further include a separate color filter (not shown) for displaying a red, green or blue color.

The light emitting layer OL may include a hole transporting layer, a light emitting material layer and an electron transporting layer. In addition, the light emitting layer OL may be provided or formed in a tandem structure of two or more stacks between which is provided a charge generating layer.

The cathode electrode CTD is provided or formed on the light emitting layer OL. The cathode electrode CTD may be provided or formed to cover the light emitting layer OL. The cathode electrode CTD may be a common layer formed commonly to the pixels PX.

In an embodiment where the light emitting element EL of the display panel 100 is provided or formed by a top emission method in which light is emitted upward, the anode electrode AND may include or be formed of a metal material having high reflectivity to have a stacked structure (Ti/Al/Ti) of aluminum and titanium, a stacked structure (ITO/Al/ITO) of aluminum and indium tin oxide ("ITO"), an APC alloy, and a stacked structure (ITO/APC/ITO) of an APC alloy and ITO. The APC alloy is an alloy of silver (Ag), palladium (Pd) and copper (Cu). Further, the cathode electrode CTD may include or be formed of a transparent conductive material ("TCO") such as ITO or indium zinc oxide ("IZO") that can transmit light or a semi-transmissive conductive material such as magnesium (Mg), silver (Ag), or an alloy of magnesium (Mg) and silver (Ag). Where the cathode electrode CTD includes or is formed of a semi-transmissive conductive material, the light emission efficiency may be increased due to a micro-cavity effect.

In an embodiment where the light emitting element EL is provided or formed by a bottom emission method in which light is emitted downward, the anode electrode AND may include or be formed of a transparent conductive material ("TCO") such as ITO or IZO or a semi-transmissive conductive material such as magnesium (Mg), silver (Ag), or an alloy of magnesium (Mg) and silver (Ag). The cathode electrode CTD may include or be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. Where the anode electrode AND includes or is formed of a semi-transmissive conductive material, the light emission efficiency may be increased due to a micro-cavity effect.

Referring back to FIG. 4, the display device 10 may include a metal wiring portion ML (e.g., conductive wiring pattern) provided in plural including a plurality of metal wiring portions ML disposed in the display area DPA of the display panel 100, for applying source voltages to the pixels PX. The metal wiring portions ML may be arranged in the lower non-display area NDA between the pad area PDA and the display area DPA, and may connect the voltage wiring portion WP in the lower non-display area NDA and a portion of the display pads PD in the pad area PDA to each other.

The sealing member 700 that is disposed in the non-display area NDA may overlap the voltage wiring portion WP and the metal wiring portions ML in the lower non-display area NDA between the pad area PDA and the display area DPA.

In a conventional display device, the sealing member 700 may have a stepped portion at an upper surface thereof depending on the arrangement of the metal wiring portions ML that connect the display pads PD and the voltage wiring portion WP. A stain may occur due to the stepped portion of the sealing member 700 at a lower side area below the display area DPA in a plan view.

In one or more embodiment of the display device 10, the stain at the lower side area below the display area DPA can be reduced or effectively prevented by designing the wirings of the metal wiring portions ML and the arrangement structure thereof such that the sealing member 700 disposed at the lower non-display area NDA of the display panel 100 does not have a stepped portion due to the metal wiring portions ML disposed therebelow.

Figure 7:
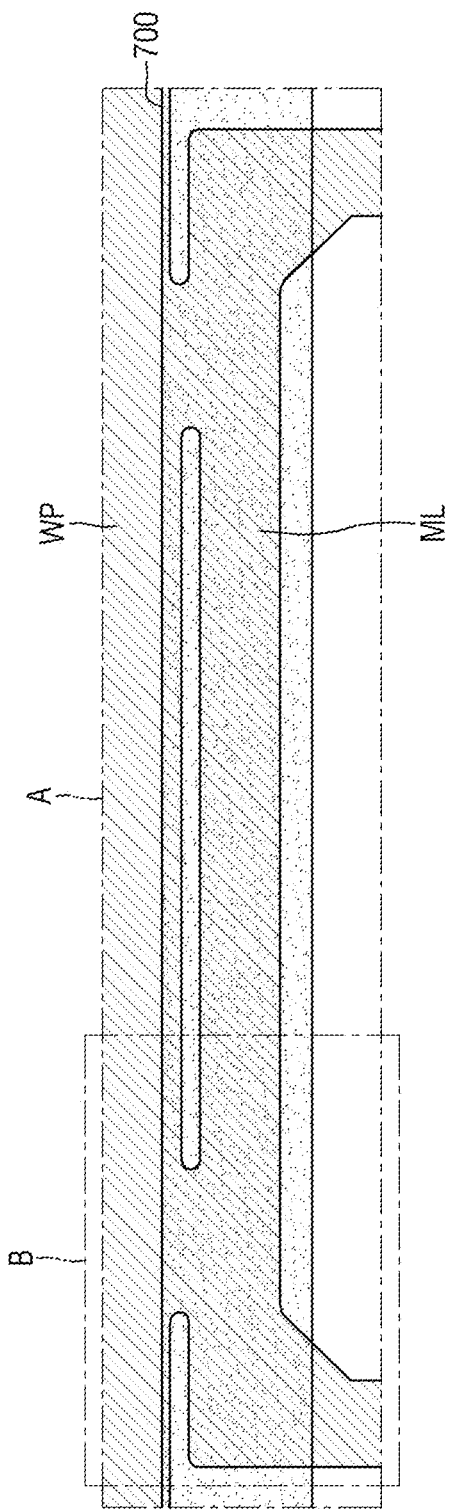
FIG. 7 is a plan view schematically showing an embodiment of portion A of FIG. 2.
Figure 8:
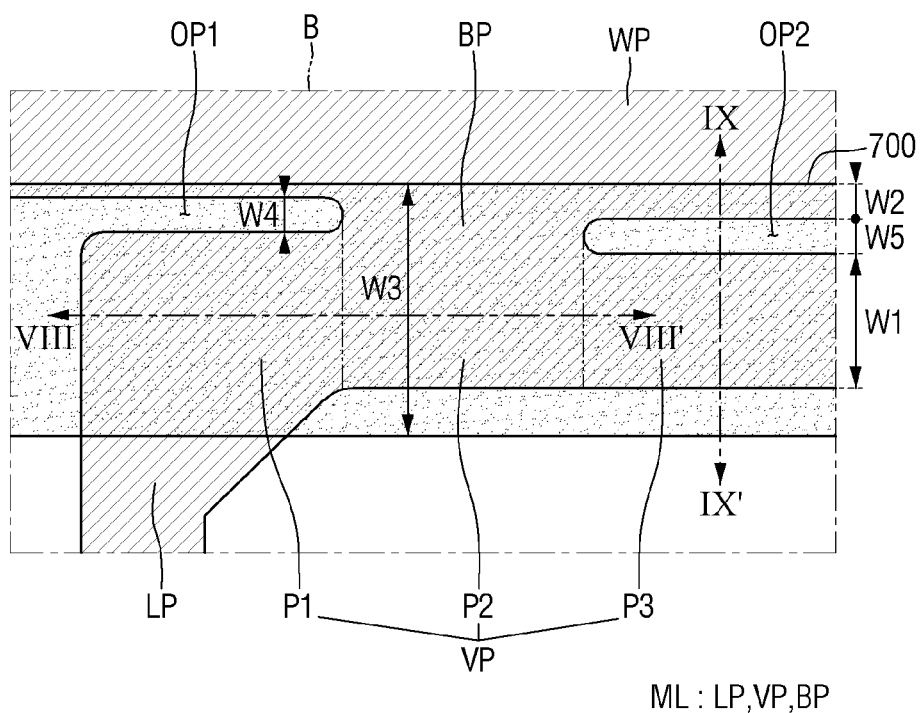
FIG. 8 is an enlarged view of an embodiment of portion B of FIG. 7.
Figure 9:
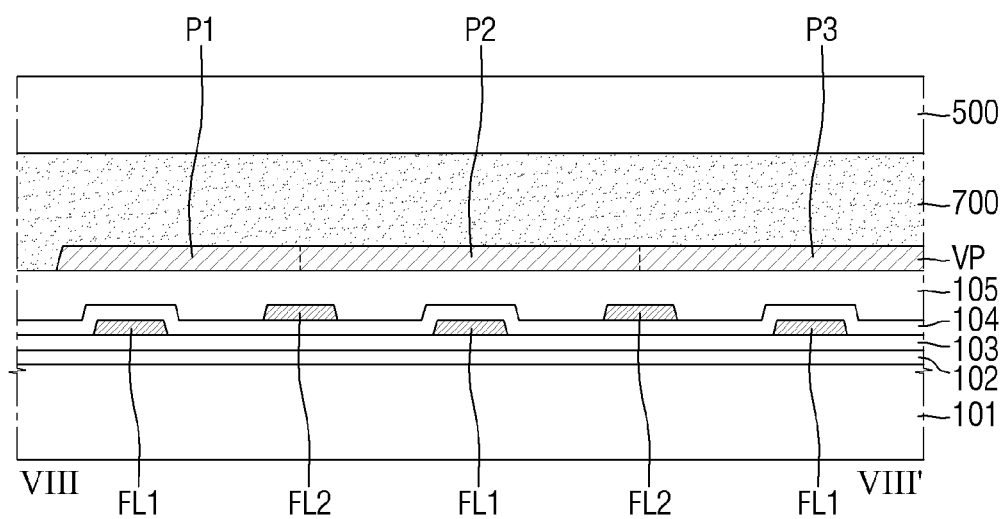
FIG. 9 is a cross-sectional view taken along line VIII-VIII' of FIG. 8.
Figure 10:
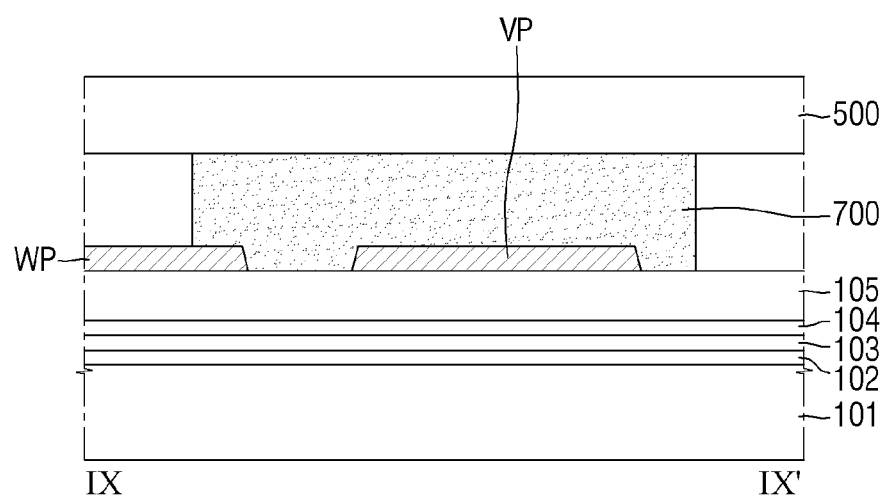
FIG. 10 is a cross-sectional view taken along line IX-IX' of FIG. 8.

FIG. 7 is a plan view schematically showing an embodiment of portion A of FIG. 2. FIG. 8 is an enlarged plan view of an embodiment of portion B of FIG. 7. FIG. 9 is a cross-sectional view taken along line VIII-VIII' of FIG. 8. FIG. 10 is a cross-sectional view taken along line IX-IX' of FIG. 8.

FIG. 7 shows a schematic arrangement of the sealing member 700, a portion of the voltage wiring portion WP and the metal wiring portions ML disposed in the lower non-display area NDA between the display area DPA and the pad area PDA, and FIG. 8 shows an enlarged view of a portion of the metal wiring portion ML.

Referring to FIGS. 7 to 10, a plurality of wirings connected to the display pads PD are disposed in the lower non-display area NDA between the pad area PDA and the display area DPA of the display panel 100. Referring to FIG. 4, for example, the plurality of fan-out lines FL, the voltage wiring portion WP, and the metal wiring portions ML may be disposed in the lower non-display area NDA. The wirings in the lower non-display area NDA may be arranged crossing the sealing member 700 disposed thereabove from an outer area toward an inner area, the outer and inner areas being divided by the sealing member 700. The outer area may be closer to the edge of the display panel 100 than the inner area.

The fan-out lines FL may include a first fan-out line FL1 provided in plural including first fan-out lines FL1 disposed on the gate insulating layer 103 and a second fan-out line FL2 provided in plural including second fan-out lines FL2 disposed on the first interlayer insulating layer 104. The first fan-out lines FL1 may be in a same first conductive layer as the gate G1 of the transistors of the pixels PX, and the second fan-out lines FL2 may be in the second conductive layer disposed between the gate insulating layer 103 and the first interlayer insulating layer 104. The first fan-out lines FL1, the gate G1 and the gate line may be respective portions of a same one of the first conductive layer. The second fan-out lines FL2 may be respective portions of a same one of the second conductive layer. The first fan-out lines FL1 and the second fan-out lines FL2 may be misaligned without overlapping each other along the thickness direction. Although the first fan-out lines FL1 and the second fan-out lines FL2 are disposed to overlap the metal wiring portions ML and the voltage wiring portion WP, they may be insulated from each other by the second interlayer insulating layer 105 disposed therebetween. That is the plurality of fan-out lines FL faces the sealing member 700 with the metal wiring portions ML therebetween.

The display device 10 may include the voltage wiring portion WP connected to the first voltage lines VDDL connected to the pixels PX, and the metal wiring portions ML connected to the voltage wiring portion WP and the display pads PD, of the display panel 100.

The voltage wiring portion WP may be disposed in the lower non-display area NDA between the display area DPA and the pad area PDA, and may transmit the source voltages from the metal wiring portions ML to the first voltage lines VDDL connected to the pixels PX. The first voltage lines VDDL extend from the voltage wiring portion WP in the second direction DR2 to be arranged across the display area DPA. Although only a portion of the voltage wiring portion WP is illustrated in the drawing to illustrate the connection portion between the metal wiring portions ML and the voltage wiring portion WP, the voltage wiring portion WP may have a length along the first direction DR1. The first voltage lines VDDL may be branched from the voltage wiring portion WP along the second direction DR2 while being spaced apart from each other to be arranged across the display area DPA. The first voltage lines VDDL may apply the first source voltages transmitted from the voltage wiring portion WP to the pixels PX. As shown in FIG. 4, the length of the voltage wiring portion WP measured along the first direction DR1 may correspond to a dimension of the display area DPA along the first direction DR1, but the disclosure is not limited thereto.

The metal wiring portions ML may be disposed between the pad area PDA and the voltage wiring portion WP to connect the voltage wiring portion WP and the display pads PD to each other. The metal wiring portions ML may be arranged from the outer area which is outside of the sealing member 700 in a plan view to a position below the sealing member 700 along the third direction DR3, to thereby connect the display pads PD and the voltage wiring portion WP to each other. The source voltages applied from the display pads PD may be transmitted to the voltage wiring portion WP through the metal wiring portions ML.

According to an embodiment, the metal wiring portion ML may include a lead-in portion LP disposed from the pad area PDA to the sealing member 700 and further below the sealing member 700, an overlapping portion VP disposed below the sealing member 700, and a connection portion BP that connects the overlapping portion VP and the voltage wiring portion WP to each other. The metal wiring portion ML may include a plurality of lead-in portions LP connected to the display pads PD, a plurality of connection portions BP connected to the voltage wiring portion WP, and the overlapping portion VP disposed respectively therebetween to overlap the sealing member 700. The plurality of lead-in portions LP, the plurality of connection portions BP and the overlapping portion VP may together form a conductive wiring pattern. The conductive wiring pattern may further include the voltage wiring portion WP without being limited thereto.

In a conventional display device, when the metal wiring portion ML has a width along the first direction DR1, the overlapping area of the metal wiring portion ML and the sealing member 700 may be small, and a stepped portion may be formed by the sealing member 700 due to a portion where the metal wiring portion ML is not disposed. In one or more embodiments, the metal wiring portion ML includes the overlapping portion VP overlapping the sealing member 700 having a width along the first direction DR1 so that the stepped portion formed by the sealing member 700 can be compensated.

Specifically, the lead-in portions LP may be portions of the metal wiring portion ML that are connected to the display pads PD. In an embodiment, for example, the lead-in portions LP may extend from the pad area PDA and along the second direction DR2 to meet and be disposed below the sealing member 700. One of the metal wiring portions ML may include the plurality of lead-in portions LP, and the plurality of display pads PD may be connected to the metal wiring portions ML. In an embodiment, for example, the metal wiring portions ML may include the plurality of lead-in portions LP located on the left side and the right side with respect to the center of the display area DPA, and each of the lead-in portions LP may be connected to at least one of the display pads PD.

In an embodiment, the lead-in portion LP may have a shape having a width along the second direction DR2 which increases along the first direction DR1. A large-width portion of the lead-in portion LP may be disposed below the sealing member 700 to overlap therewith. As the width of the lead-in portion LP gradually increases from the pad area PDA toward the sealing member 700, the area where the sealing member 700 and the lead-in portion LP overlap each other increases, which reduces the stepped portion formed by the wirings below the sealing member 700.

The connection portion BP may be a portion of the metal wiring portion ML that is connected to the voltage wiring portion WP. In an embodiment, for example, the connection portion BP that connects the overlapping portion VP and the voltage wiring portion WP may be disposed to overlap the sealing member 700 and have a width. One of the metal wiring portions ML includes the plurality of connection portions BP as well as the plurality of lead-in portions LP. In an embodiment, for example, the metal wiring portion ML may include the plurality of connection portions BP located on the left side and the right side with respect to the center of the display area DPA.

The width of the connection portion BP measured along the first direction DR1 may be smaller than the maximum width of the lead-in portion LP measured along the first direction DR1, and may be smaller than the width of the overlapping portion VP measured along the first direction DR1. Since the connection portion BP has a width smaller than that of the overlapping portion VP, the position where the voltage wiring portion WP and the metal wiring portion ML are connected by the connection portion BP may be specified. Since the width of the connection portion BP is not excessively large, a uniform source voltage is applied to the entirety of the display area DPA regardless of the distance thereof to the pad area PDA where the connection portions BP are disposed at the time of applying the source voltages through the display pads PD. However, the disclosure is not limited thereto. In an embodiment, the overlapping portion VP of the metal wiring portion ML may be directly connected to the metal wiring portion ML without the connection portion BP.

The overlapping portion VP may be a portion of the metal wiring portion ML that is disposed between the lead-in portion LP and the connection portion BP. The overlapping portion VP may extend along the first direction DR1 and overlap the entirety of the sealing member 700. The overlapping portion VP further includes a portion spaced apart from the voltage wiring portion WP, in addition to portions corresponding to the lead-in portion LP and the connection portion BP, so that the stepped portion formed by the wirings below the sealing member 700 can be compensated.

In an embodiment, the overlapping portion VP may include a first portion P1 connected to the lead-in portion LP, a second portion P2 connected to the connection portion BP, and a third portion P3 spaced apart from the voltage wiring portion WP. The first portion P1 extending from the lead-in portion LP along the second direction DR2 may be spaced apart from the voltage wiring portion WP at a location below the sealing member 700. The second portion P2 extending from the connection portion BP along the second direction DR2 may be connected to the first portion P1 at a location below the sealing member 700. The metal wiring portion ML may have a shape in which the lead-in portion LP and the connection portion BP are misaligned without being formed in parallel along the second direction DR2, and may be connected by the first portion P1 and the second portion P2 of the overlapping portion VP, respectively.

The third portion P3, which is directly connected to the second portion P2, but not directly connected to the connection portion BP, and extends along the first direction DR1 from the second portion P2, may be spaced apart from the voltage wiring portion WP at a location where the voltage wiring portion WP is below the sealing member 700. In an embodiment, the metal wiring portion ML may include only the lead-in portion LP, the first portion P1, the second portion P2 and the connection portion BP, and may be connected to the voltage wiring portion WP. However, one or more embodiment of the metal wiring portion ML may further include the third portion P3 of the overlapping portion VP that extends along the first direction DR1 and beyond the connection portion BP, so that the stepped portion that may be formed by the wirings below the sealing member 700 disposed in the lower non-display area NDA may be minimized.

In portions of the non-display area NDA other than where the sealing member 700 is disposed, the components such as the first scan driver 110 and the second scan driver 120 and the like are arranged, so that the sealing member 700 may have fewer stepped portions depending on positions along the non-display area NDA. In the lower non-display area NDA between the display area DPA and the pad area PDA, only the fan-out lines FL, the voltage wiring portion WP and the metal wiring portions ML are arranged. Since the fan-out lines FL, the voltage wiring portion WP and the metal wiring portions ML each have a relatively small width, the planar area of the region where the wirings are not disposed below the sealing member 700 may be large.

As will be described later, the voltage wiring portion WP and the metal wiring portions ML may be provided or formed in a same third conductive layer of the display area DPA, and the sealing member 700 may be disposed directly on the third conductive layer.

In a conventional display device, when the metal wiring portions ML that connect the voltage wiring portion WP and the display pads PD include only the lead-in portions LP and the connection portions BP and thus have a small width, the sealing member 700 may have a stepped portion formed by the underlying wirings of the third conductive layer, and the height difference of the sealing member 700 can be visually recognized as a stain from the outside. In one or more embodiment of the display device 10, the metal wiring portions ML of the display panel 100 may further include the third portion P3 to compensate the stepped portion that may be formed by the wirings below the sealing member 700. The sealing member 700 may overlap the metal wiring portions ML disposed therebelow in a large planar area and, thus, the height difference of the sealing member 700 can be minimized, which reduces or effectively prevents the occurrence of the stain that is recognized from the outside.

The metal wiring portion ML and the voltage wiring portion WP are connected to each other by the connection portion BP, and spaces may be formed at locations other than the connection portion BP, e.g., between the voltage wiring portion WP and the first portion P1 and between the voltage wiring portion WP and the third portion P3. A portion of the voltage wiring portion WP which is closest to the metal wiring portion ML may be disposed to overlap the sealing member 700, and the first portion P1 and the third portion P3 may be spaced apart from the portion at which the voltage wiring portion WP overlaps the sealing member 700. The sealing member 700 does not entirely overlap the metal wiring portion ML provided or formed as a respective portion of the third conductive layer, and may have a portion that does not overlap the metal wiring portion ML.

Referring to FIG. 7, for example, a single one of the metal wiring portion ML may include the plurality of lead-in portions LP and the plurality of connection portions BP, and the overlapping portion VP therebetween may be provided or formed as one integrated member. In an embodiment, for example, with respect to the center of the display area DPA along the first direction DR1, the lead-in portion LP and the connection portion BP located on the left side may be connected to the lead-in portion LP and the connection portion BP located on the right side, by the overlapping portion VP disposed between. The overlapping portion VP may include the first portion P1 and the second portion P2 respectively corresponding to the lead-in portion LP and the connection portion BP, and the third portion P3 that connects the first portion P1 and the second portion P2. That is the metal wiring portion ML may include a plurality of first portions P1, a plurality of second portions P2 and the third portion P3. However, the disclosure is not limited thereto, and the metal wiring portion ML may be provided in plural including a plurality of metal wiring portions ML that are distinguished to correspond to the respective lead-in portions LP. Where the metal wiring portions ML are distinguished from each other, the third portion P3 may be provided in plural including third portions P3 of the metal wiring portions ML which are spaced apart from each other.

According to an embodiment, a first dimension W1 (e.g., width) of the overlapping portion VP of the metal wiring portion ML may be smaller than a third dimension (e.g., width) W3 of the sealing member 700. A maximum of a second dimension (e.g., maximum width) W2 of a portion of the voltage wiring portion WP that overlaps the sealing member 700 may be smaller than the first dimension W1 of the overlapping portion VP. Since the metal wiring portion ML further includes the third portion P3 of the overlapping portion VP, the overlapping area of the metal wiring portion ML and the sealing member 700 may increase in a region other than the portion where the lead-in portion LP and the connection portion BP are disposed. The third portion P3 and a portion of the voltage wiring portion WP may be disposed below the sealing member 700 in the region corresponding to the third portion P3, and the wirings below the sealing member 700 may overlap the sealing member 700 by a maximum width W1+W2 that is the sum of the first dimension W1 of the third portion P3 and the second dimension W2 of a portion of the voltage wiring portion WP, with respect to the third dimension W3 of the sealing member 700. Since the third portion P3 extends along the first direction DR1, the wirings below the sealing member 700 may overlap the sealing member 700 by the maximum width W1+W2 for a dimension along the first direction DR1, and the stepped portion of the sealing member 700 can be minimized.

In one embodiment, a fourth dimension W4 (e.g., width) of a first space OP1 where the first portion P1 and the voltage wiring portion WP are spaced apart from each other may be substantially the same as a fifth dimension W5 (e.g., width) of a second space OP2 where the third portion P3 and the voltage wiring portion WP are spaced apart from each other. The first space OP1 where the first portion P1 and the voltage wiring portion WP are spaced apart from each other may be misaligned with the second space OP2 where the third portion P3 and the voltage wiring portion WP are spaced apart from each other, without being formed in parallel along the first direction DR1. In other words, the upper side of the first portion P1 and the upper side of the third portion P3 may be misaligned without being formed in parallel along the first direction DR1, and the voltage wiring portion WP may overlap the sealing member 700 in a larger planar area at a portion spaced apart from the third portion P3.

The voltage wiring portion WP and the metal wiring portions ML may be provided or formed as portions of a same conductive layer in which the source S1 and the drain D1 of each of the pixels PX are disposed. That is, the voltage wiring portion WP and the metal wiring portions ML may be in a same layer as each other. Elements which are in a same layer as each other, may be respective patterns or respective portions of a same material layer.

The passivation layer 107 (refer to the display area DPA shown in FIG. 6) may not be disposed in the non-display area NDA, and the metal wiring portions ML and the voltage wiring portion WP in the non-display area NDA may be in direct contact with the sealing member 700 (FIGS. 9 and 10). However, the disclosure is not limited thereto, and the passivation layer 107 may extend from the display area DPA be disposed in the non-display area NDA. Where the passivation layer 107 is disposed in the non-display area NDA, the metal wiring portions ML and the voltage wiring portion WP may not be in contact with the sealing member 700.

In the display device 10, the metal wiring portions ML that are disposed on the display panel 100 to connect the voltage wiring portion WP and the display pads PD may have a planar shape by which a large planar area of the sealing member 700 is overlapped by the metal wiring portions ML. A stepped portion formed by wirings below the sealing member 700 can be minimized, and the display device 10 reduces or effectively prevents the occurrence of the stain due to the stepped portion of the sealing member 700.

Hereinafter, various embodiments of the display device 10 will be described with reference to other drawings.

Figure 11:
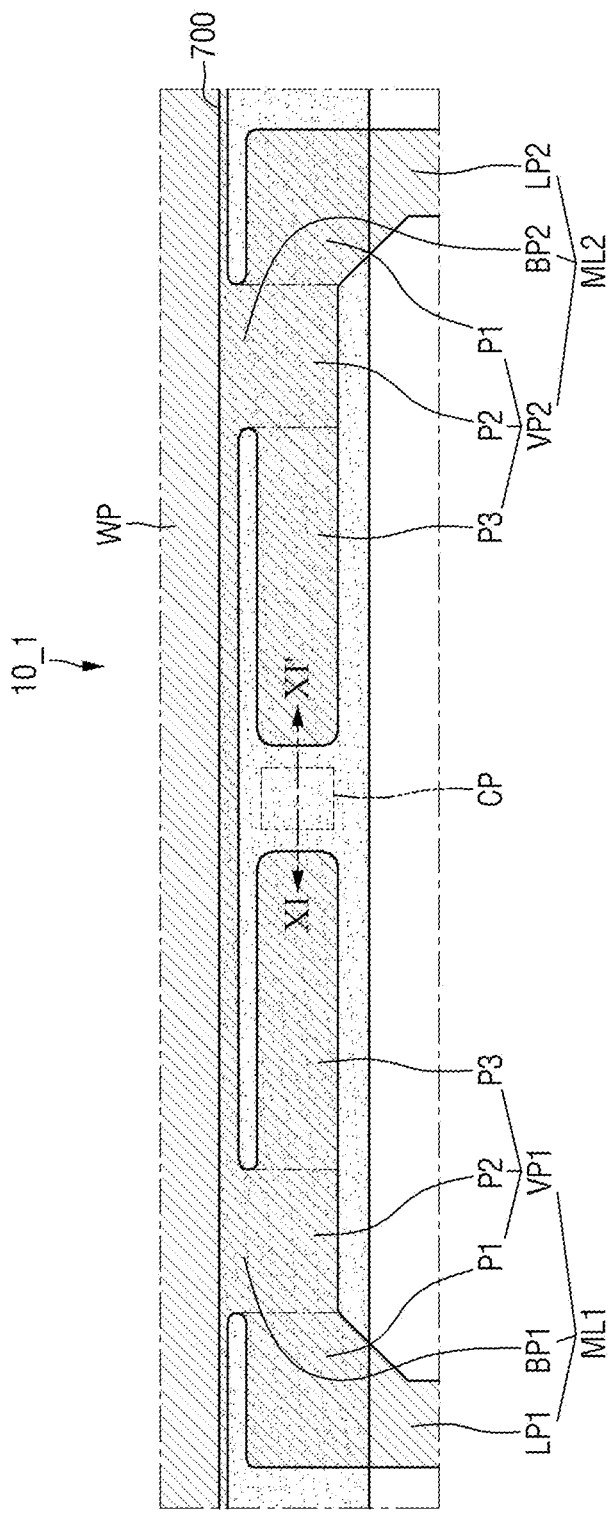
FIG. 11 is a plan view illustrating a schematic arrangement of an embodiment of metal wiring portions of a display device.
Figure 12:
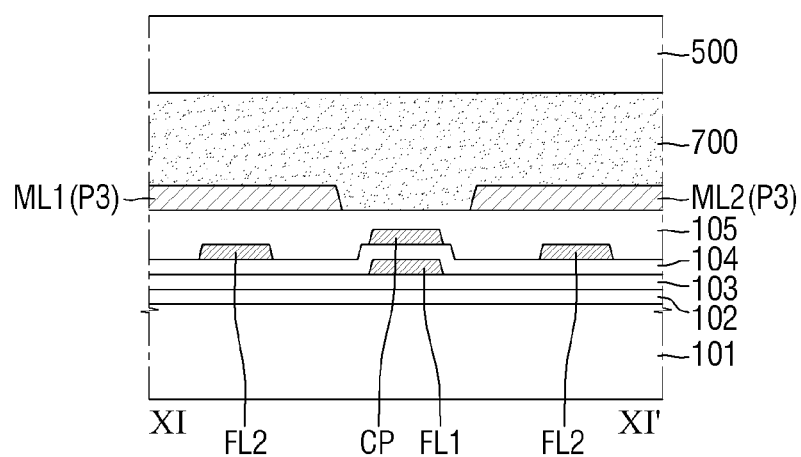
FIG. 12 is a cross-sectional view taken along line XI-XI' of FIG. 11.

FIG. 11 is a plan view illustrating a schematic arrangement of an embodiment of a plurality of metal wiring portions ML1 and ML2 of a display device 10_1. FIG. 12 is a cross-sectional view taken along line XI-XI' of FIG. 11.

FIG. 12 shows a cross-section of a conductive pattern CP. The metal wiring portions ML1 and ML2 and various portions thereof may together form a conductive wiring pattern. The conductive wiring pattern may further include the voltage wiring portion WP without being limited thereto.

Referring to FIGS. 11 and 12, a display device 10_1 may include metal wiring portions ML1 and ML2 disposed on the display panel 100 and having third portions P3 spaced apart from each other. In addition, the conductive pattern CP may be disposed between the metal wiring portions ML1 and ML2 spaced apart from each other to be positioned on the conductive layer disposed therebelow. The embodiment of FIGS. 11 and 12 is different from the embodiment of FIG. 6 in that the plurality of metal wiring portions ML1 and ML2 include a plurality of overlapping portions VP spaced from each other, and also includes the conductive pattern CP disposed between the metal wiring portions ML1 and ML2 spaced apart from each other. In the following description, a redundant description will be omitted and differences will be mainly described.

In the view of FIG. 11, the metal wiring portions ML1 and ML2 may include a first metal wiring portion ML1 located on the left side and a second metal wiring portion ML2 located on the right side with respect to the center of the voltage wiring portion WP. A center of the voltage wiring portion WP may correspond to the conductive pattern CP, without being limited thereto. The first metal wiring portion ML1 and the second metal wiring portion ML2 may be connected to the display pads PD through the lead-in portions LP, and may be connected to the voltage wiring portion WP through the connection portions BP. The overlapping portion VP may be disposed between the lead-in portion LP and the connection portion BP within each of the metal wiring portions ML1 and ML2, and may include the first portion P1, the second portion P2 and the third portion P3.

The first metal wiring portion ML1 includes a first lead-in portion LP1, a first overlapping portion VP1, and a first connection portion BP1 located on the left side with respect to the center of the voltage wiring portion WP, and the second metal wiring portion ML2 includes a second lead-in portion LP2, a second overlapping portion VP2, and a second connection portion BP2 located on the right side with respect to the center of the voltage wiring portion WP. The first metal wiring portion ML1 and the second metal wiring portion ML2 may have a symmetrical structure with respect to the center of the voltage wiring portion WP.

The first lead-in portion LP1 and the second lead-in portion LP2 may be arranged from the pad area PDA toward the sealing member 700. Each of the first lead-in portion LP1 and the second lead-in portion LP2 may be connected to at least one of the display pads PD. The first connection portion BP1 and the second connection portion BP2 may partially overlap the sealing member 700 while being connected to the voltage wiring portion WP. The first lead-in portion LP1 and the second lead-in portion LP2 may be spaced apart from each other along the first direction DR1, and the first connection portion BP1 and the second connection portion BP2 may be spaced apart from each other along the first direction DR1. A separation distance (e.g., first gap) along the first direction between the lead-in portions LP1 and LP2 is greater than a separation distance (e.g., a second gap) between the connection portions BP1 and BP2, and the lead-in portions LP1 and LP2 may be misaligned with the connection portions BP1 and BP2 without being formed in parallel along the second direction DR2. The first overlapping portion VP1 and the second overlapping portion VP2, each including the first portion P1, the second portion P2 and the third portion P3, may be disposed between the lead-in portions LP1 and the LP2 and the connection portions BP1 and BP2, respectively, along the second direction DR2.

In an embodiment, the third portion P3 of the first metal wiring portion ML1 may be spaced apart from the third portion P3 of the second metal wiring portion ML2 along the first direction DR1. Although the first metal wiring portion ML1 and the second metal wiring portion ML2 are disposed in a same third conductive layer, the third portions P3 may be spaced apart from each other at a location under the sealing member 700. At the location where the third portions P3 are spaced apart from each other, the second interlayer insulating layer 105 disposed therebelow may be exposed to outside the metal wiring portion ML1 and ML2, and a portion of the bottom surface of the sealing member 700 may be in direct contact with the second interlayer insulating layer 105 between the third portions P3. Since the third portions P3 of the metal wiring portions ML1 and ML2 are spaced apart from each other, a stepped portion may be partially formed by the wirings below the sealing member 700. However, the overlapping portions VP of the metal wiring portions ML1 and ML2 may overlap the sealing member 700 in a sufficient planar area at location other than the location where the third portions P3 are spaced apart from each other. Even when the display panel 100 includes the plurality of metal wiring portions ML1 and ML2 in which the third portions P3 are spaced apart from each other, the sealing member 700 may overlap the wirings disposed therebelow such that the occurrence of the stain due to the stepped portion can be reduced or effectively prevented.

In an embodiment, the display panel 100 may further include the conductive pattern CP that is provided or formed as a conductive layer disposed below the metal wiring portions ML1 and ML2, and the conductive pattern CP may not overlap the metal wiring portions ML1 and ML2 disposed on the third conductive layer along the thickness direction. That is, the conductive pattern CP may be spaced apart from both the metal wiring portions ML1 and ML2. The conductive pattern CP may be provided or formed as a respective portion of the second conductive layer disposed below the second interlayer insulating layer 105. The conductive pattern CP may be provided or formed in a same layer as the second fan-out lines FL2, and may be disposed between the second fan-out lines FL2 which are adjacent to each other. The conductive pattern CP may overlap a portion of the first fan-out lines FL1 disposed therebelow, but the disclosure is not limited thereto.

In an embodiment, the conductive pattern CP may be a pattern having a serial number corresponding to a display panel 100. Since the display area DPA of the display panel 100 is increased and the planar areas of the non-display area NDA and the pad area PDA are minimized, the serial number for distinguishing the display panel 100 may be displayed below the sealing member 700. When the conductive pattern CP is provided formed as a respective portion of the second conductive layer, the conductive pattern CP may not overlap the third conductive layer disposed thereabove along the thickness direction so that it is possible to recognize the serial number provided or formed at the conductive pattern CP from outside the display panel 100 and/or the display device 10_1.

Accordingly, the metal wiring portions ML1 and ML2 disposed in the lower non-display area NDA between the pad area PDA and the display area DPA may not overlap each other along the thickness direction so that the conductive pattern CP having the serial number is visible from outside the display panel 100 and/or the display device 10_1. The display panel 100 includes the first metal wiring portion ML1 and the second metal wiring portion ML2 in which the third portions P3 are spaced apart from each other, and the conductive pattern CP may be disposed between the third portions P3 spaced apart from each other. The separation distance between the third portions P3 may be greater than a dimension of the conductive pattern CP along the first direction DR1, and the conductive pattern CP may not overlap (e.g., be spaced apart from) the third portions P3 of the metal wiring portions ML1 and ML2. The metal wiring portions ML1 and ML2 have the third portions P3 spaced apart from each other by a separation distance that allows the conductive pattern CP to be recognized from outside of the display panel 100 and/or the display device 10_1, and may be arranged to have a planar area which reduces or effectively prevents a stepped portion from being provided or formed by the wirings below the sealing member 700. That is, the planar area of the conductive pattern CP may occupy a planar area at the gap between the third portions P3 of the metal wiring portions ML1 and ML2 such that a downward recess of the sealing member 700 at the location of the gap is minimized, thereby reducing or preventing a stepped portion.

Figure 13:
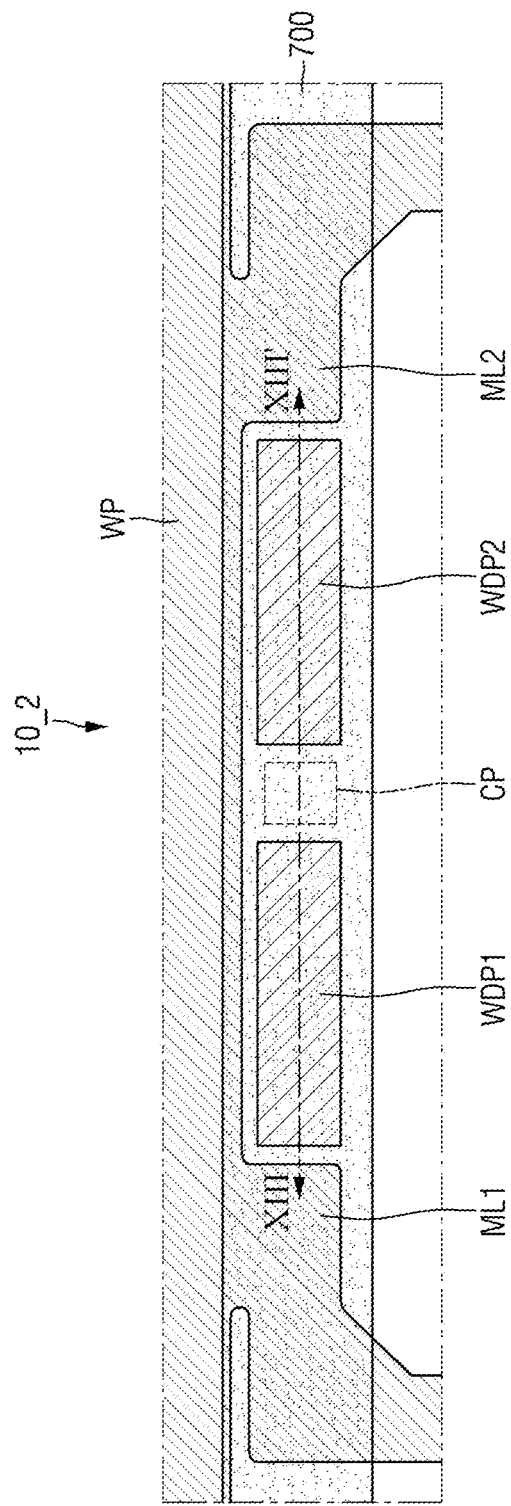
FIG. 13 is a plan view illustrating a schematic arrangement of an embodiment of metal wiring portions of a display device.
Figure 14:
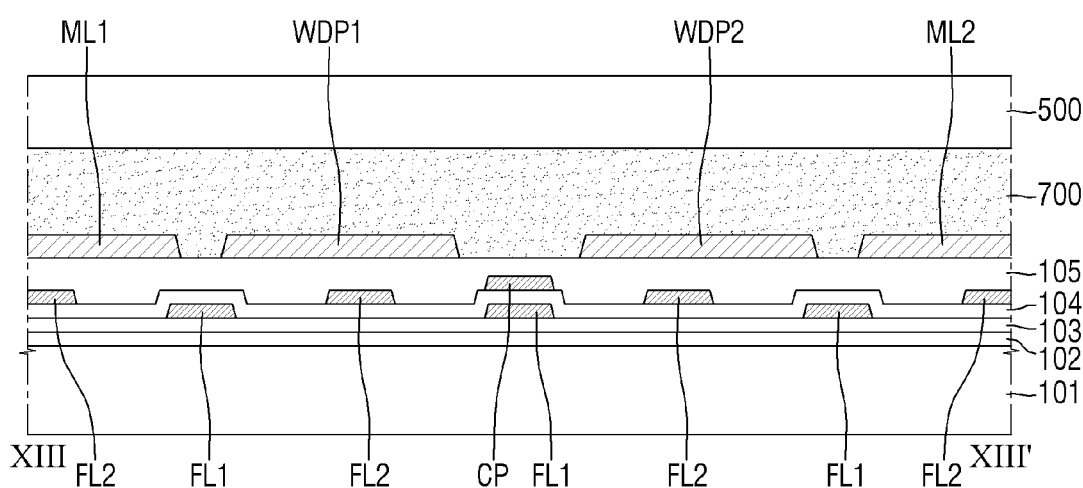
FIG. 14 is a cross-sectional view taken along line XIII-XIII' of FIG. 13.

FIG. 13 is a plan view illustrating a schematic arrangement of an embodiment of metal wiring portions ML1 and ML2 of a display device 10_2. FIG. 14 is a cross-sectional view taken along line XIII-XIII' of FIG. 13.

Referring to FIGS. 13 and 14, a display device 10_2 excludes the third portions P3 of the metal wiring portions ML1 and ML2 previously described and instead may include a plurality of dummy patterns WDP1 and WDP2 disposed below the sealing member 700 along the thickness direction while being disconnected from the metal wiring portions ML1 and ML2. The embodiment is different from the embodiment of FIG. 11 in that the overlapping portion VP of each of the metal wiring portions ML1 and ML2 includes only the first portions P1 and the second portions P2 and the dummy patterns WDP1 and WDP2 are disposed between the second portions P2 of the metal wiring portions ML1 and ML2. In an embodiment, the overlapping portion VP may be considered as including the dummy patterns WDP1 and WDP2, or the third portions P3 may be considered as the dummy patterns WDP1 and WDP2. The metal wiring portions ML1 and ML2 and the dummy patterns WDP1 and WDP2 may together form a conductive wiring pattern. The conductive wiring pattern may further include the voltage wiring portion WP without being limited thereto. In the following description, a redundant description will be omitted and differences will be mainly described.

The metal wiring portions ML1 and ML2 may include the lead-in portions LP, the first portions P1, the second portions P2 and the connection portions BP and may be arranged from the pad area PDA to the lower non-display area NDA. In the metal wiring portions ML1 and ML2 of FIGS. 11 and 12, the third portions P3 are omitted, so that the planar area where the sealing member 700 overlaps the metal wiring portions ML1 and ML2 can be slightly reduced. Even if the metal wiring portions ML1 and ML2 exclude the third portions P3, the display panel 100 may include the plurality of dummy patterns WDP1 and WDP2 disposed in the lower non-display area NDA between the display area DPA and the display area DPA in order to compensate the stepped portion of the sealing member 700.

The dummy patterns WDP1 and WDP2 may include the first dummy pattern WDP1 spaced apart from the second portion P2 of the first metal wiring portion ML1 and the second dummy pattern WDP2 spaced apart from the second portion P2 of the second metal wiring portion ML2. The first dummy pattern WDP1 and the second dummy pattern WDP2 may be disposed between the second portions P2 of the first metal wiring portion ML1 and the second metal wiring portion ML2, and may be spaced apart from each other along the first direction DR1. The conductive pattern CP may be disposed between the first dummy pattern WDP1 and the second dummy pattern WDP2 to be positioned on the conductive layer disposed therebelow, and the dummy patterns WDP1 and WDP2 may not overlap the conductive pattern CP along the thickness direction.

The first dummy pattern WDP1 and the second dummy pattern WDP2 may overlap the sealing member 700 while being spaced apart from the voltage wiring portion WP. The dummy patterns WDP1 and WDP2 may be disposed at positions corresponding to the third portions P3 of the metal wiring portions ML1 and ML2 (FIGS. 11 and 12, for example), and can compensate the stepped portion provided or formed by the wirings below the sealing member 700. The dimensions of the first dummy pattern WDP1 and the second dummy pattern WDP2 along the second direction DR2 may be substantially the same as those of the third portions P3, and may be smaller than that of the sealing member 700. In the embodiment, although the lengths of the dummy patterns WDP1 and WDP2 of the metal wiring portions ML1 and ML2 along the first direction DR1 are relatively small, the dummy pattern WDP1 and WDP2 provided as disconnected members of the conductive wiring pattern can reduce or effectively prevent the occurrence of the stain due to the stepped portion of the sealing member 700.

Although FIG. 14 illustrates that the dummy patterns WDP1 and WDP2 are provided or formed in a same third conductive layer as the metal wiring portions ML1 and ML2, the disclosure is not limited thereto. In an embodiment, the dummy patterns WDP1 and WDP2 may be provided or formed as a conductive layer disposed above the metal wiring portions ML1 and ML2 (e.g., in a different layer than the third conductive layer which is further from the base substrate 101 than the third conductive layer).

Figure 15:
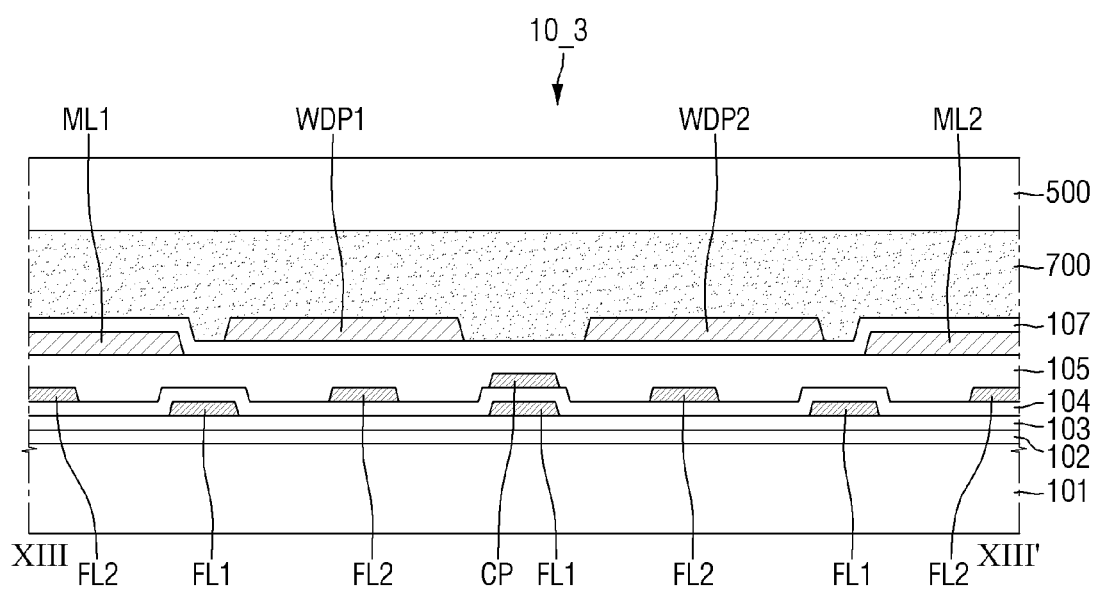
FIG. 15 is a cross-sectional view showing an embodiment of metal wiring portions of a display device.

FIG. 15 is a cross-sectional view showing an embodiment of metal wiring portions ML1 and ML2 of a display device 10_3.

Referring to FIG. 15, in a display device 10_3, the dummy patterns WDP1 and WDP2 may be provided or formed as a conductive layer (e.g., fourth conductive layer) disposed in a layer different from a layer in which the voltage wiring portion WP and the metal wiring portions ML1 and ML2 are disposed. The passivation layer 107 in the display area DPA may be further disposed in the non-display area NDA. The passivation layer 107 in the non-display area NDA is below the sealing member 700 to cover the third conductive layer in which the metal wiring portions ML1 and ML2 are disposed, and the plurality of dummy patterns WDP1 and WDP2 may be directly disposed on the passivation layer 107. The embodiment is the same as the embodiment of FIG. 14 except for the layer in which the dummy patterns WDP1 and WDP2 are disposed. In the following description, a redundant description will be omitted and differences will be mainly described.

Referring to FIG. 6, for example, the passivation layer 107, the planarization layer 108 and the anode electrode AND may be disposed on the sources S1 and the drains D1 of the transistors of the pixels PX arranged in the display area DPA of the display panel 100. The passivation layer 107 may extend from the display area DPA to be further disposed below the sealing member 700 in the lower non-display area NDA, and the dummy patterns WDP1 and WDP2 may be disposed on the passivation layer 107. The dummy patterns WDP1 and WDP2 may be provided formed as a conductive layer disposed in a layer different from the layer in which the metal wiring portions ML1 and ML2 are disposed as long as dummy patterns WDP1 and WDP2 can compensate the stepped portion while being located below the sealing member 700. Although the example in which the dummy patterns WDP1 and WDP2 are provided or formed as the conductive layer disposed on the passivation layer 107 is illustrated in the drawing, the disclosure is not limited thereto. In an embodiment, the dummy patterns WDP1 and WDP2 may be provided or formed as a conductive layer disposed in a same layer as the anode electrode AND of the pixel PX.

Figure 16:
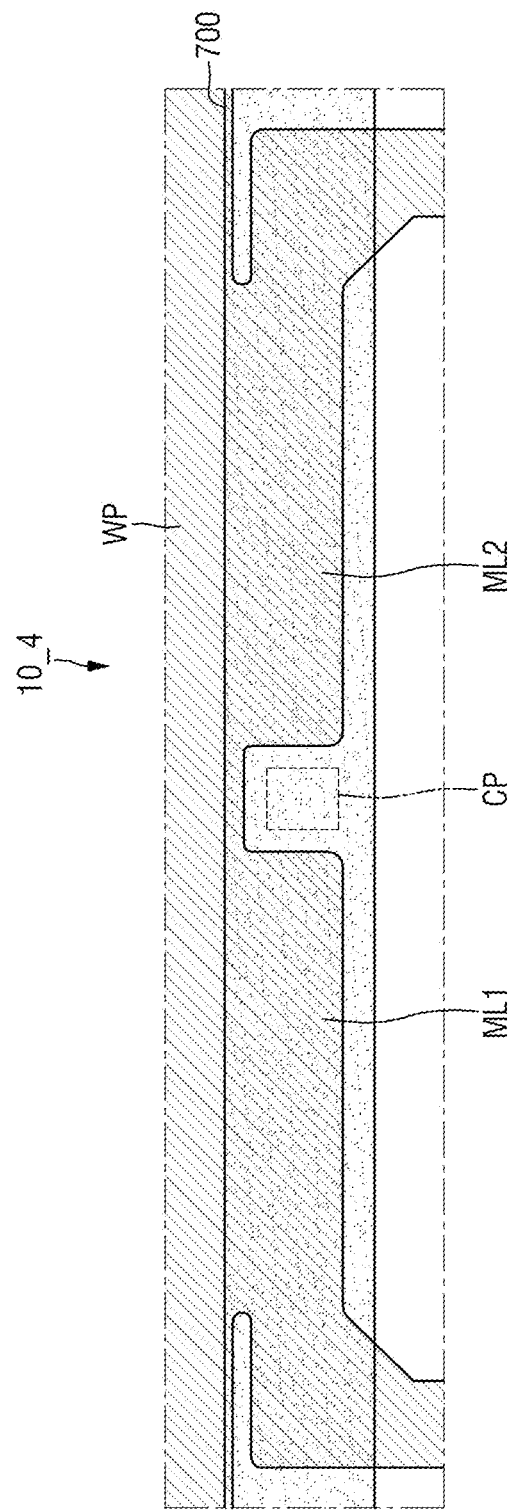
FIG. 16 is a plan view illustrating a schematic arrangement of an embodiment of metal wiring portions of a display device.

FIG. 16 is a plan view illustrating a schematic arrangement of an embodiment of a plurality of metal wiring portions ML1 and ML2 of a display device 10_4.

Referring to FIG. 16, in a display device 10_4, the third portions P3 of the metal wiring portions ML may be directly connected to the voltage wiring portion WP at the first portion P1, the second portion P2 and the third portion P3, and the connection portions BP may be omitted. The embodiment is different from the embodiment of FIG. 10 in that the third portions P3 of the metal wiring portions ML are in contact with the voltage wiring portion WP as one body without being spaced apart therefrom.

As described above, in the metal wiring portion ML, the overlapping portion VP is spaced apart from the voltage wiring portion WP and is connected to the voltage wiring portion WP through the connection portion BP having a width, such that the source voltages are applied to the pixels PX arranged in the display area DPA. However, even if the position where the metal wiring portion ML is connected to the voltage wiring portion WP through the connection portion BP is not specified, the source voltages may still be applied to the pixels PX. Where the metal wiring portion ML excludes the connection portion BP, in the metal wiring portion ML, the third portion P3 is in direct contact with the voltage wiring portion WP, so that the overlapping area of the sealing member 700 and the metal wiring portion ML can be further increased. In the display device 10_4, the overlapping area of the metal wiring portion ML and the sealing member 700 is further increased, so that the stepped portion that may be provided or formed at the sealing member 700 can be further reduced.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:
1. A display device comprising:
 a display panel including:
  a display area, a non-display area and a pad area in order along a first direction,
  a plurality of pads in the pad area,
  a voltage wiring pattern which is in the non-display area and connected to a pixel in the display area, and
  between the plurality of pads and the voltage wiring pattern along the first direction, a metal wiring pattern which is in the non-display area and connects a pad of the plurality of pads to the voltage wiring pattern;
 an encapsulation substrate facing the display panel; and a sealing member which is in the non-display area, between the pad area and the voltage wiring pattern, and couples the display panel and the encapsulation substrate to each other, wherein between the plurality of pads and the voltage wiring pattern, along the first direction:

the metal wiring pattern includes in order from the plurality of pads to the voltage wiring pattern:

a lead-in portion connected to the pad of the plurality of pads, and an overlapping portion which overlaps the sealing member and connects the lead-in portion to the voltage wiring pattern, the sealing member has a total width along the first direction, and the overlapping portion of the metal wiring pattern overlaps less than the total width of the sealing member along the first direction.

2. The display device of claim 1, wherein
the overlapping portion includes in order along a second direction crossing the first direction:
a first portion corresponding to the lead-in portion,
a second portion corresponding to a connection portion connecting the overlapping portion of the metal wiring pattern to the voltage wiring pattern, and
a third portion extending from the second portion in a direction away from the first portion, and
along the first direction:
a portion of the voltage wiring pattern is between the display area and the sealing member,
the third portion of the metal wiring pattern is spaced apart from the portion of the voltage wiring pattern, and
a first space is defined between the third portion of the metal wiring pattern and the voltage wiring pattern at which the sealing member is exposed from the metal wiring pattern.

3. The display device of claim 2, wherein within the metal wiring pattern:
the lead-in portion is provided in plural including a plurality of lead-in portions spaced apart from each other along the second direction,
the connection portion is provided in plural including a plurality of connection portions spaced apart from each other along the second direction,
a first gap is defined between the plurality of lead-in portions, and
a second gap is defined between the plurality of connection portions,
wherein the first gap is larger than the second gap.

4. The display device of claim 3, wherein along the first direction:
the metal wiring pattern is spaced apart from the voltage wiring pattern at the first portion of the metal wiring pattern, and
the lead-in portion and the connection portion are misaligned with each other.

5. The display device of claim 4, wherein along the first direction:
each of the first portion and the third portion of the metal wiring pattern has an upper side which is closest to the voltage wiring pattern, and
the upper side of the first portion and the upper side of the third portion are spaced apart from each other.

6. The display device of claim 3, wherein within the metal wiring pattern:

the second portion is provided in plural including a plurality of second portions respectively corresponding to the plurality of connection portions, and
along the second direction, the third portion is between the plurality of second portions.

7. The display device of claim 2, wherein along the first direction:
a second space is defined between the first portion of the metal wiring pattern and the voltage wiring pattern at which the sealing member is exposed from the metal wiring pattern, and
the first space is equal to the second space.

8. The display device of claim 2, wherein along the first direction:
the portion of the voltage wiring pattern which is between the display area and the sealing member overlaps the sealing member by a width of the voltage wiring pattern,
each of the sealing member and the third portion of the metal wiring pattern has a width, and
the width of the sealing member is greater than a sum of the width of the voltage wiring pattern and the width of the third portion of the metal wiring pattern.

9. The display device of claim 2, wherein
the metal wiring pattern is provided in plural including a first metal wiring pattern and a second metal wiring pattern in order along the second direction,
each of the first metal wiring pattern and the second metal wiring pattern includes the lead-in portion, the connection portion and the overlapping portion, and
along the second direction:
the third portion of the first metal wiring pattern and the third portion of the second metal wiring pattern are spaced apart from each other,
the voltage wiring pattern includes a center, and
the first metal wiring pattern and the second metal wiring pattern are symmetrical with respect to the center of the voltage wiring pattern.

10. The display device of claim 9, further comprising along the second direction, a conductive pattern between the third portion of the first metal wiring pattern and the third portion of the second metal wiring pattern,
wherein along the second direction, the conductive pattern is spaced apart from both the third portion of the first metal wiring pattern and the third portion of the second metal wiring pattern.

11. The display device of claim 10, wherein
the display panel further includes:
a first conductive layer including the conductive pattern, and
a second conductive layer including both the first metal wiring pattern and the second metal wiring pattern, and
the second conductive layer is between the sealing member and the first conductive layer.

12. The display device of claim 2, wherein
the display panel further includes:
a plurality of fan-out lines extending from the plurality of pads towards the sealing member,
a first conductive layer including the plurality of fan-out lines, and
a second conductive layer including the metal wiring pattern, and
the plurality of fan-out lines of the first conductive layer faces the sealing member with the metal wiring pattern of the second conductive layer therebetween.

13. The display device of claim 1, wherein the display panel further includes a plurality of first voltage lines extending along the first direction and connecting the voltage wiring pattern to the pixel in the display area, the plurality of first voltage lines spaced apart from each other along the second direction in the display area.

14. The display device of claim 1, wherein
the overlapping portion includes in order along a second direction crossing the first direction:
   a first portion corresponding to the lead-in portion,
   a second portion corresponding to a connection portion connecting the overlapping portion of the metal wiring pattern to the voltage wiring pattern, and
   a third portion extending from the second portion in a direction away from the first portion, and
the metal wiring pattern is in direct contact with the voltage wiring pattern at the third portion of the metal wiring pattern.

15. A display device comprising:
a display panel including:
   a display area, a non-display area and a pad area in order along a first direction,
   a voltage wiring pattern which is in the non-display area and connected to the display area,
   a plurality of pads in the pad area, and
   between the plurality of pads and the voltage wiring pattern along the first direction, a metal wiring pattern which connects a pad of the plurality of pads to the voltage wiring pattern;
an encapsulation substrate facing the display panel; and
a sealing member which is in the non-display area, between the plurality of pads and the voltage wiring pattern, and couples the display panel and the encapsulation substrate to each other,
wherein between the plurality of pads and the voltage wiring pattern, along the first direction:
   the sealing member has a total width along the first direction,
   the metal wiring pattern includes in order from the plurality of pads to the voltage wiring pattern:
      a lead-in portion connected to the pad the plurality of pads, and
      an overlapping portion which overlaps the sealing member, the overlapping portion including:
         a connection portion connecting the lead-in portion to the voltage wiring pattern, and
         a dummy pattern which is adjacent to the connection portion along a second direction crossing the first direction, the dummy pattern disconnected from the connection portion and the voltage wiring pattern,
      wherein the dummy pattern overlaps less than the total width of the sealing member along the first direction.

16. The display device of claim 15, wherein
the metal wiring pattern is provided in plural including a first metal wiring pattern and a second metal wiring pattern spaced apart from each other along the second direction,
each of the first metal wiring pattern and the second metal wiring pattern includes the connection portion of the overlapping portion, and
along the second direction, the dummy pattern is between the connection portion of the first metal wiring pattern and the connection portion of the second metal wiring pattern.

17. The display device of claim 16, wherein
the dummy pattern of the overlapping portion is provided in plural including a first dummy pattern and a second dummy pattern disconnected from and spaced apart from each other along the second direction, and
along the first direction:
   each of the sealing member, the first dummy pattern and the second dummy pattern has a width,
   each of the first dummy pattern and the second dummy pattern is disconnected from and spaced apart from the voltage wiring pattern, and
   the width of each of the first dummy pattern and the width of the second dummy pattern is smaller than the width of the sealing member.

18. The display device of claim 16, wherein the connection portion and the dummy pattern are respective portions of a same material layer.

19. The display device of claim 16, wherein the display panel further includes a passivation layer between the dummy pattern and connection portion.

20. The display device of claim 16, wherein the dummy pattern is provided in plural including a first dummy pattern and a second dummy pattern disconnected from and spaced apart from each other along the second direction,
further comprising along the second direction, a conductive pattern which is disconnected from the metal wiring pattern and between and spaced apart from both the first dummy pattern and the second dummy pattern.

* * * * *